(12) United States Patent
Chu et al.

(10) Patent No.: US 11,908,748 B2
(45) Date of Patent: *Feb. 20, 2024

(54) SEMICONDUCTOR DEVICES AND METHODS OF FORMING THE SAME

(71) Applicant: Taiwan Semiconductor Manufacturing Co., Ltd., Hsin-Chu (TW)

(72) Inventors: Feng-Ching Chu, Pingtung County (TW); Wei-Yang Lee, Taipei (TW); Feng-Cheng Yang, Hsinchu County (TW); Yen-Ming Chen, Hsin-Chu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/055,498

(22) Filed: Nov. 15, 2022

(65) Prior Publication Data
US 2023/0084821 A1     Mar. 16, 2023

Related U.S. Application Data

(63) Continuation of application No. 17/116,808, filed on Dec. 9, 2020, now Pat. No. 11,502,005.
(Continued)

(51) Int. Cl.
*H01L 21/8238* (2006.01)
*H01L 27/092* (2006.01)
(Continued)

(52) U.S. Cl.
CPC .... *H01L 21/823814* (2013.01); *H01L 21/308* (2013.01); *H01L 21/3065* (2013.01);
(Continued)

(58) Field of Classification Search
CPC ......... H01L 21/823814; H01L 21/3065; H01L 21/308; H01L 21/823821;
(Continued)

(56) References Cited

U.S. PATENT DOCUMENTS 6,270,634 B1   8/2001   Kumar et al.
8,796,666 B1   8/2014   Huang et al.
(Continued)

FOREIGN PATENT DOCUMENTS

TW    201245889 A    11/2012

*Primary Examiner* — Karen Kusumakar
*Assistant Examiner* — Adam S Bowen
(74) *Attorney, Agent, or Firm* — HAYNES AND BOONE, LLP

(57) ABSTRACT

A semiconductor device includes a substrate having a first region and a second region of opposite conductivity types, an isolation feature over the substrate, a first fin protruding from the substrate and through the isolation feature in the first region, a first epitaxial feature over the first fin, a second fin protruding from the substrate and through the isolation feature in the second region, and a second epitaxial feature over the second fin. A portion of the isolation feature located between the first fin and the second fin protrudes from a top surface of the isolation feature.

20 Claims, 27 Drawing Sheets

Related U.S. Application Data

(60) Provisional application No. 62/978,647, filed on Feb. 19, 2020.

(51) Int. Cl.
  *H01L 29/08* (2006.01)
  *H01L 21/3065* (2006.01)
  *H01L 21/308* (2006.01)
  *H01L 29/66* (2006.01)

(52) U.S. Cl.
  CPC ........ *H01L 21/823821* (2013.01); *H01L 21/823878* (2013.01); *H01L 27/0924* (2013.01); *H01L 29/0847* (2013.01); *H01L 29/66636* (2013.01)

(58) Field of Classification Search
  CPC ........ H01L 21/823878; H01L 27/0924; H01L 29/0847; H01L 29/66636; H01L 21/31133; H01L 21/31138; H01L 21/31144; H01L 29/66545; H01L 29/7848; H01L 29/165; H01L 21/823431; H01L 21/823412; H01L 21/823418; H01L 21/823481; H01L 27/0886; H01L 29/0649; H01L 29/0653; H01L 29/0684; H01L 29/1033
  See application file for complete search history.

(56) References Cited

U.S. PATENT DOCUMENTS

| | | | |
|---|---|---|---|
| 9,093,530 | B2 | 7/2015 | Huang et al. |
| 9,213,234 | B2 | 12/2015 | Chang |
| 9,223,220 | B2 | 12/2015 | Chang |
| 9,256,133 | B2 | 2/2016 | Chang |
| 9,536,759 | B2 | 1/2017 | Yang et al. |
| 9,548,303 | B2 | 1/2017 | Lee et al. |
| 9,857,684 | B2 | 1/2018 | Lin et al. |
| 9,859,206 | B2 | 1/2018 | Yu et al. |
| 9,875,892 | B2 | 1/2018 | Chang et al. |
| 10,658,463 | B2 | 5/2020 | Jung et al. |
| 2004/0259037 | A1 | 12/2004 | Hatakeyama et al. |
| 2013/0184404 | A1 | 7/2013 | Hatakeyama et al. |
| 2017/0269748 | A1 | 9/2017 | Ding et al. |
| 2018/0151378 | A1 | 5/2018 | Huang et al. |
| 2018/0175046 | A1* | 6/2018 | Chiou ................ H01L 29/7848 |

* cited by examiner

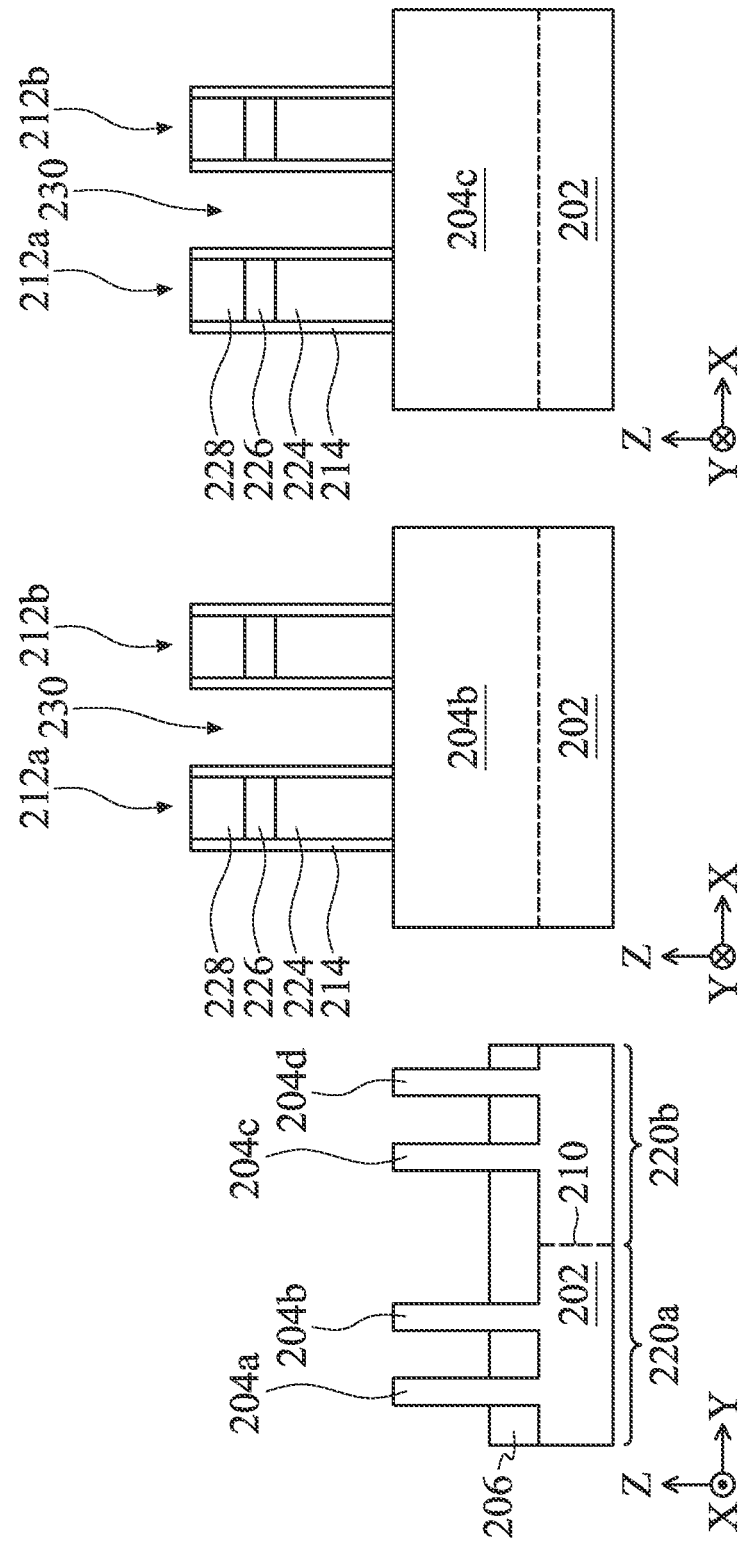

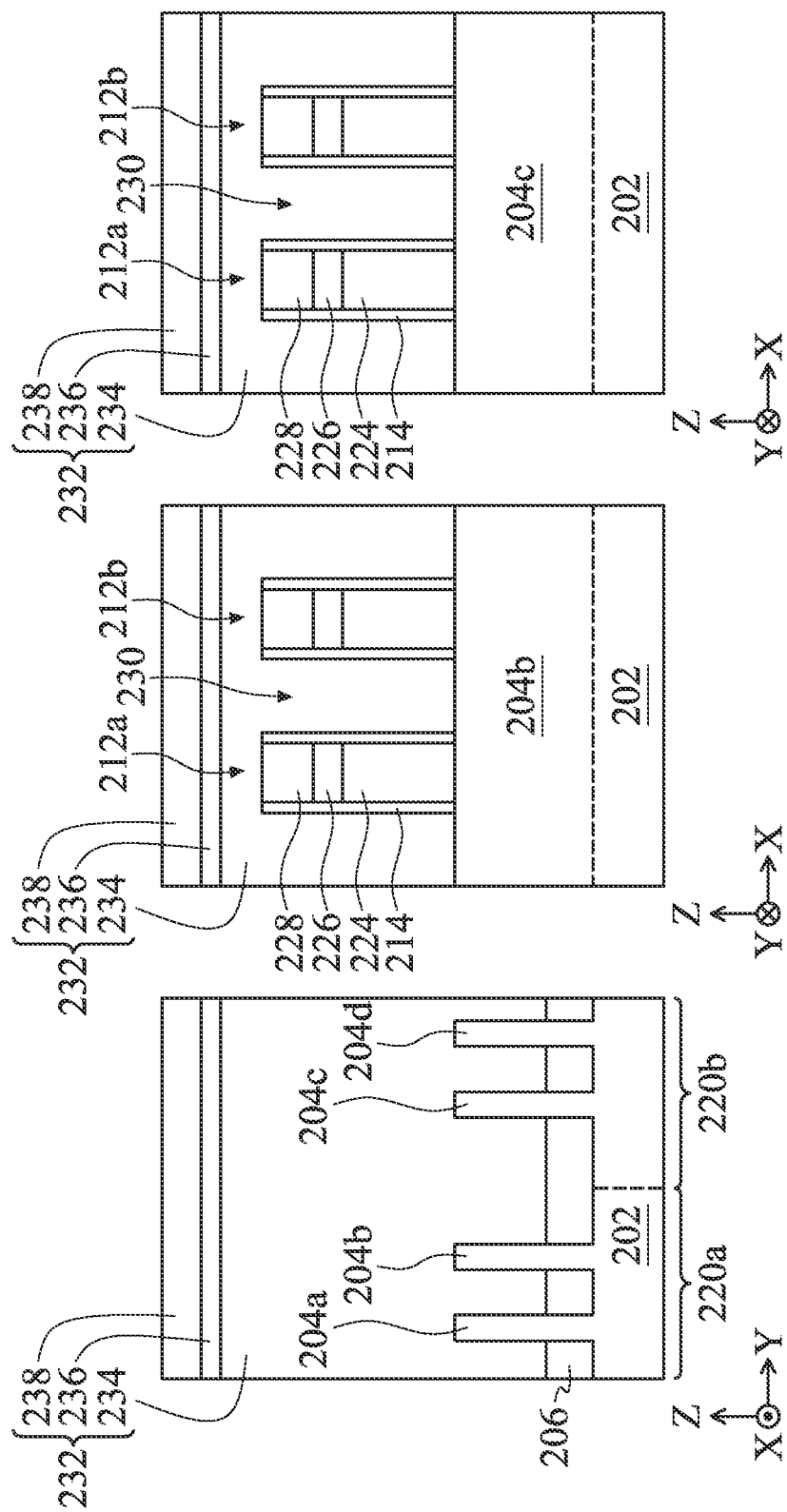

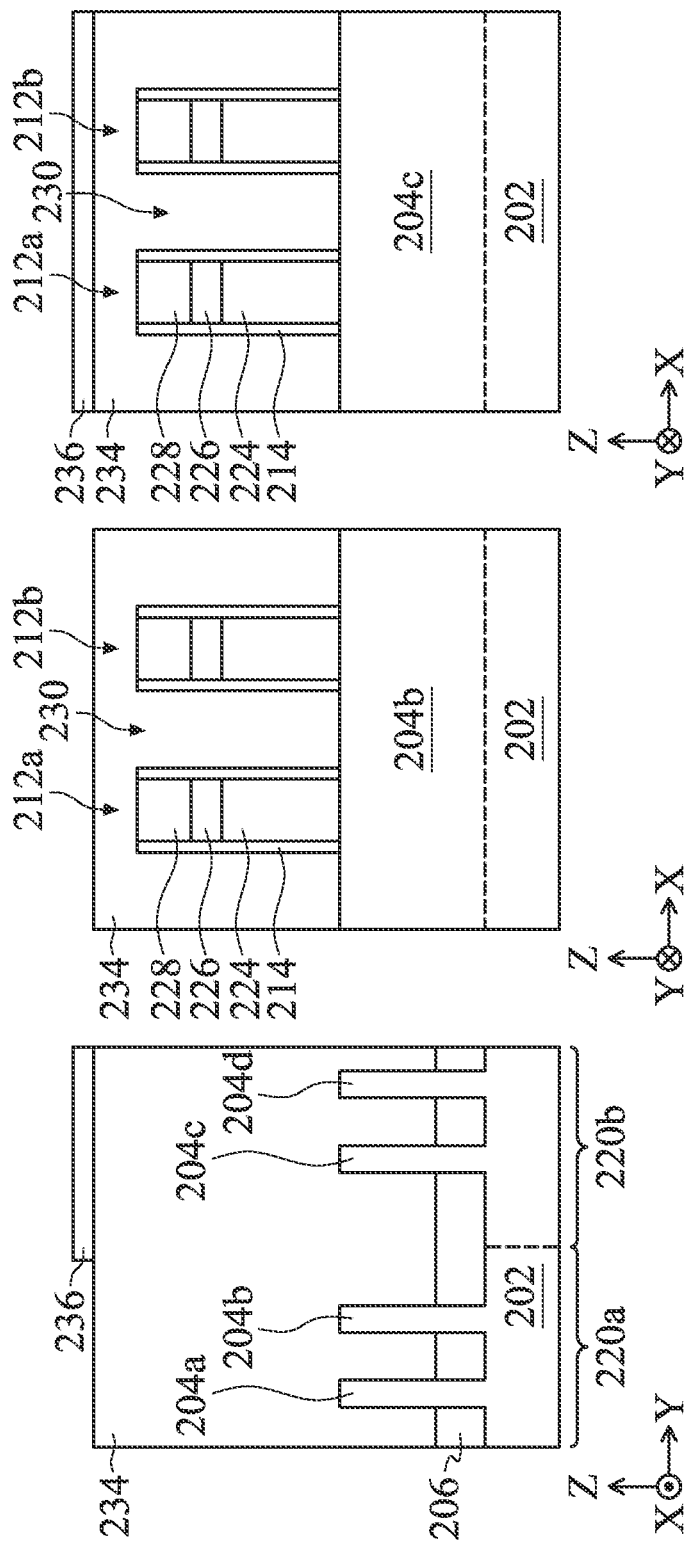

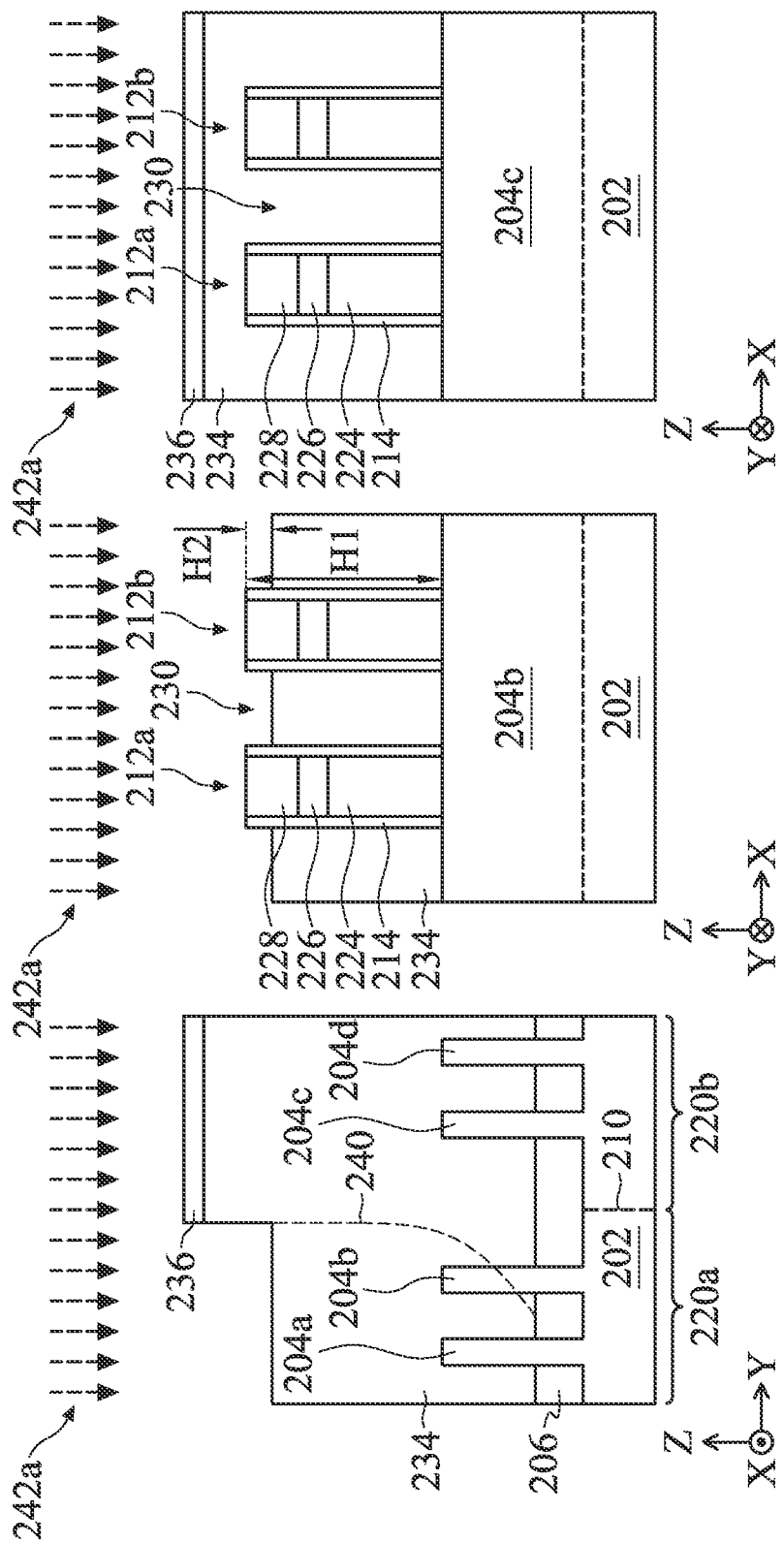

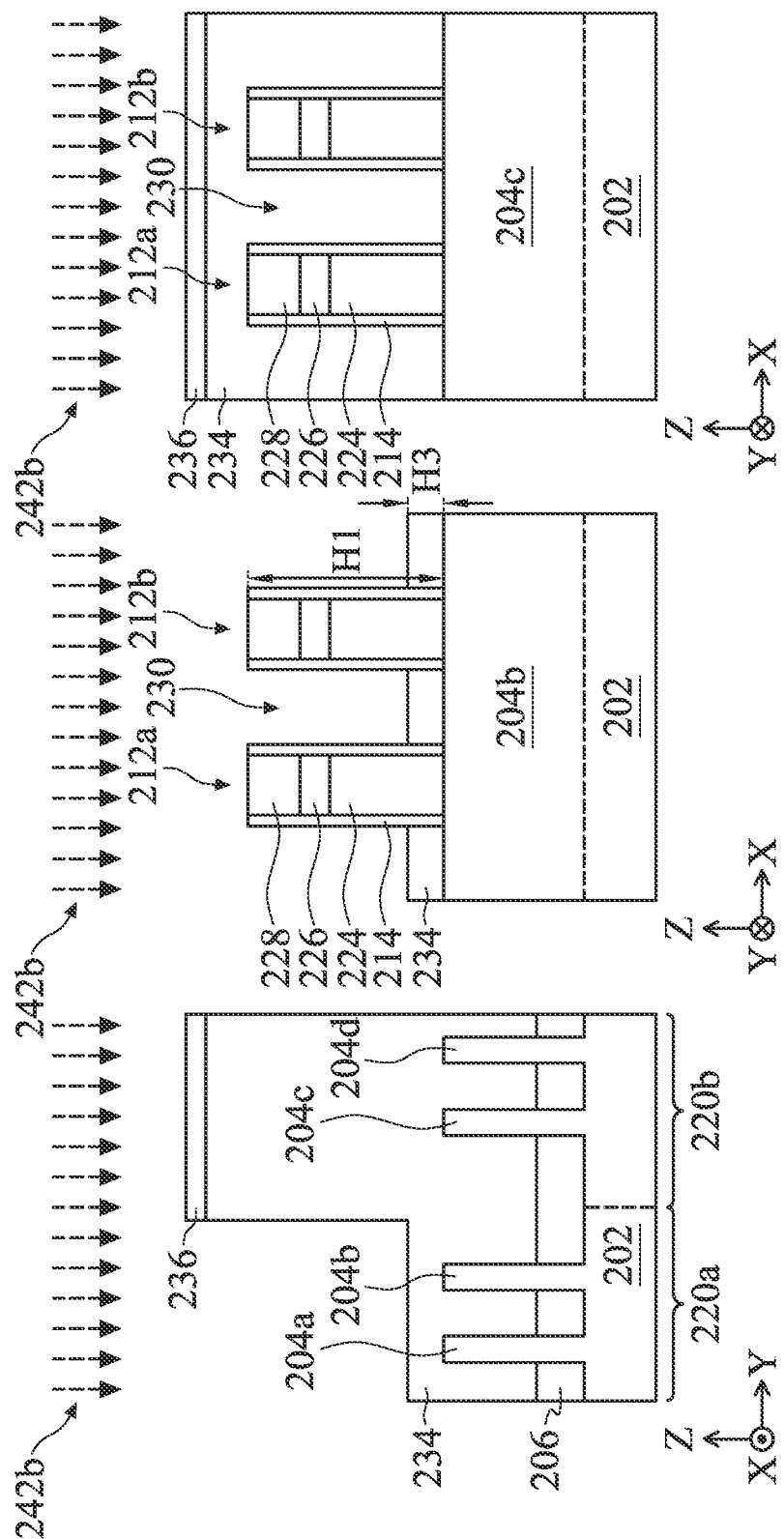

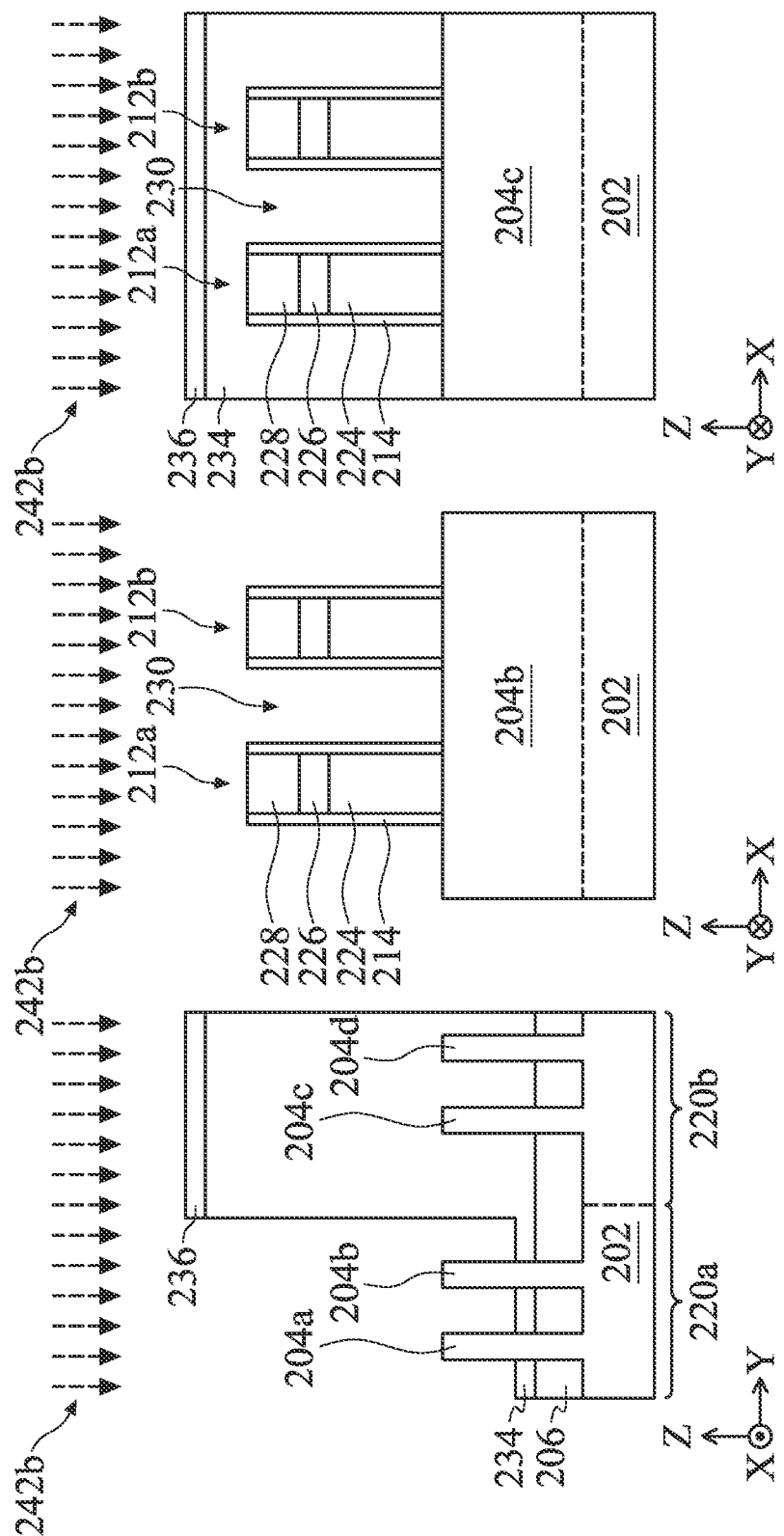

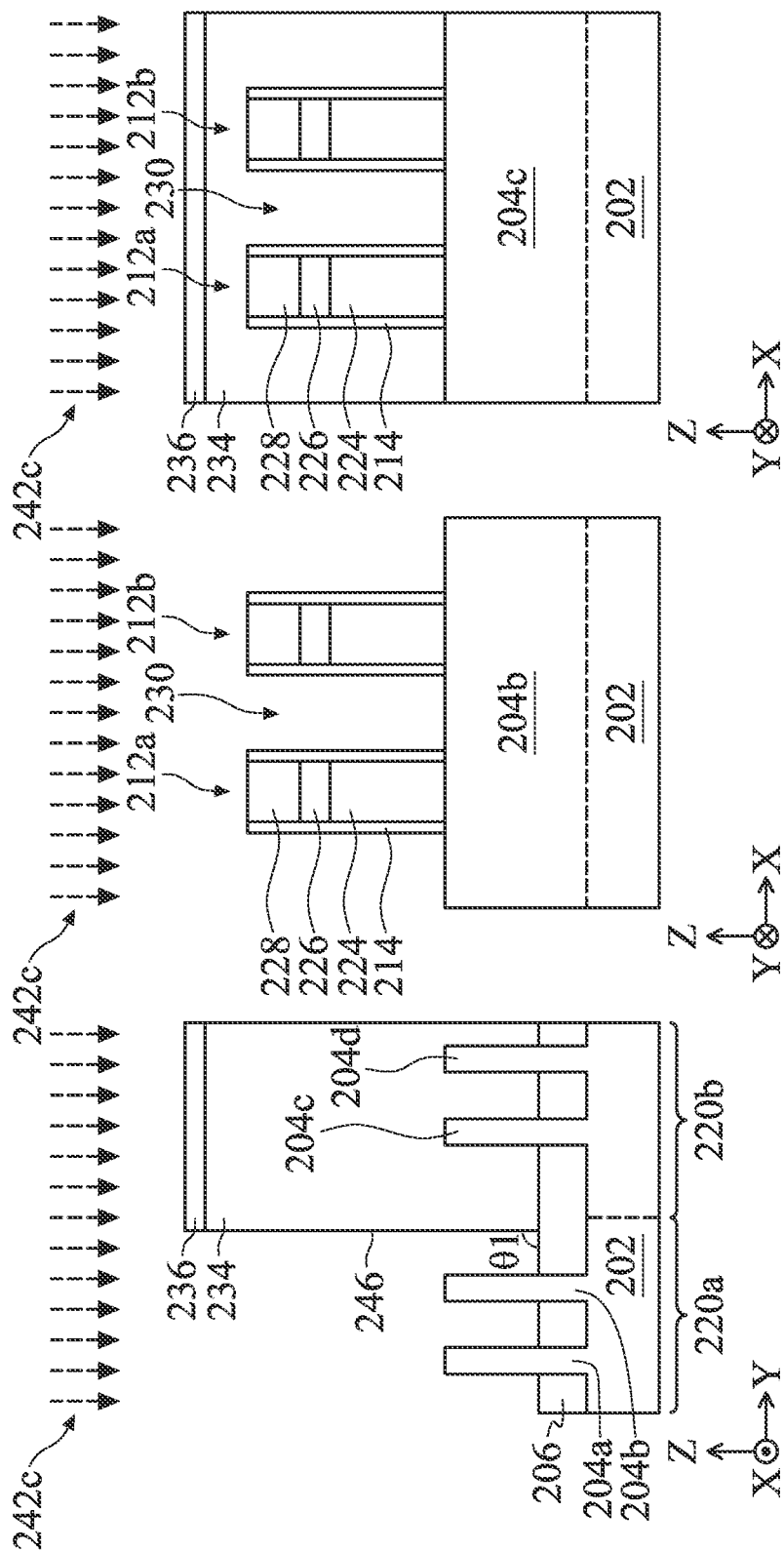

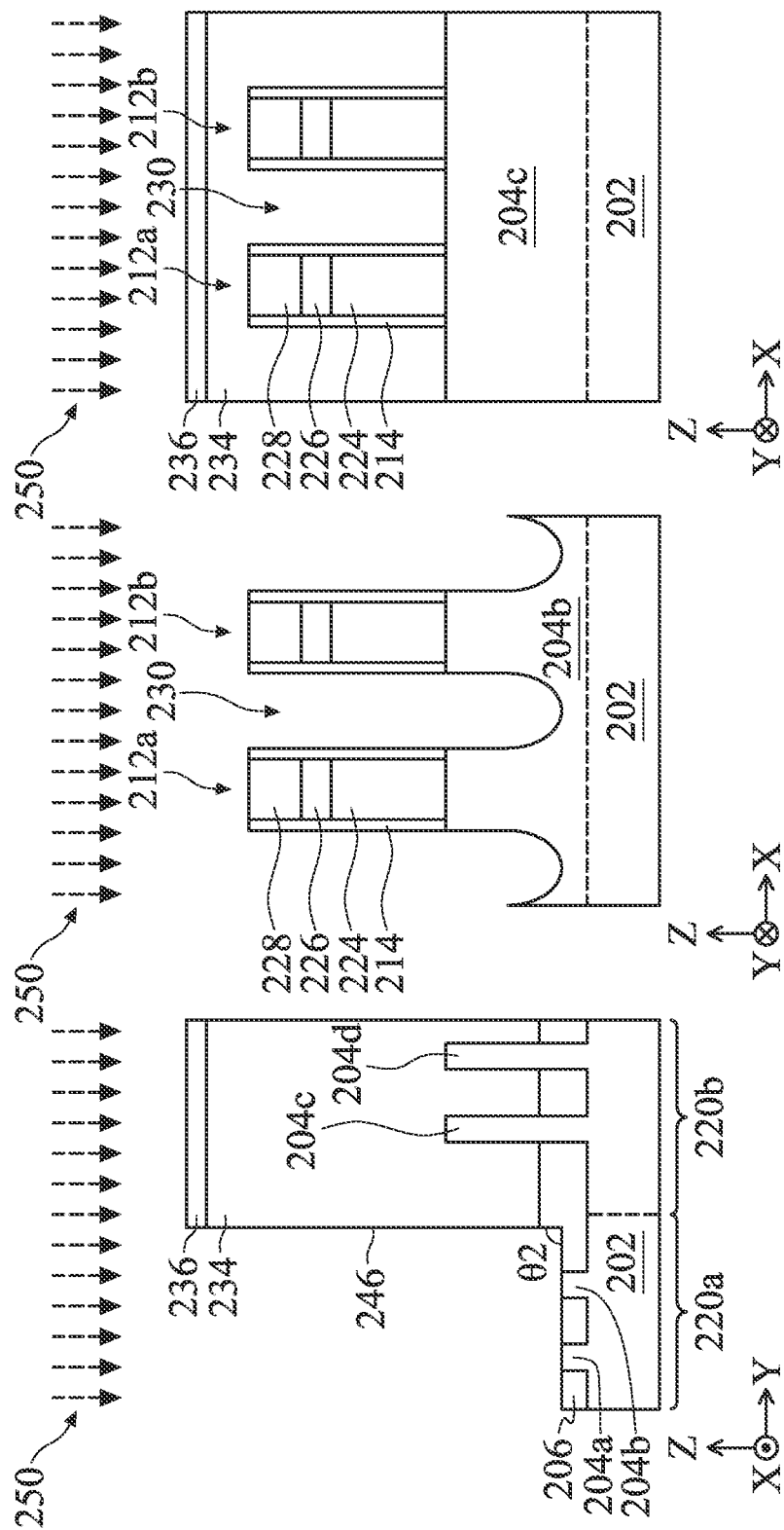

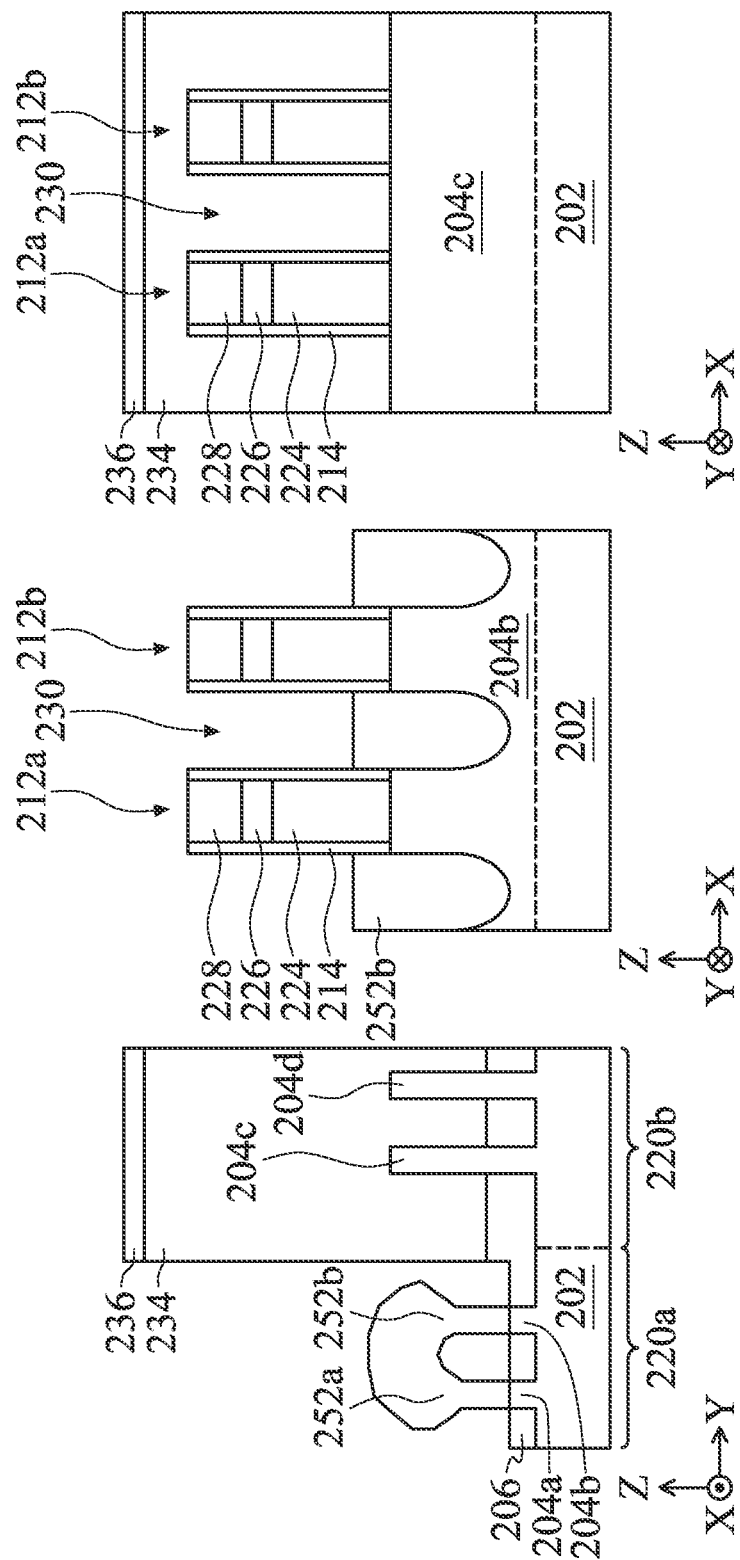

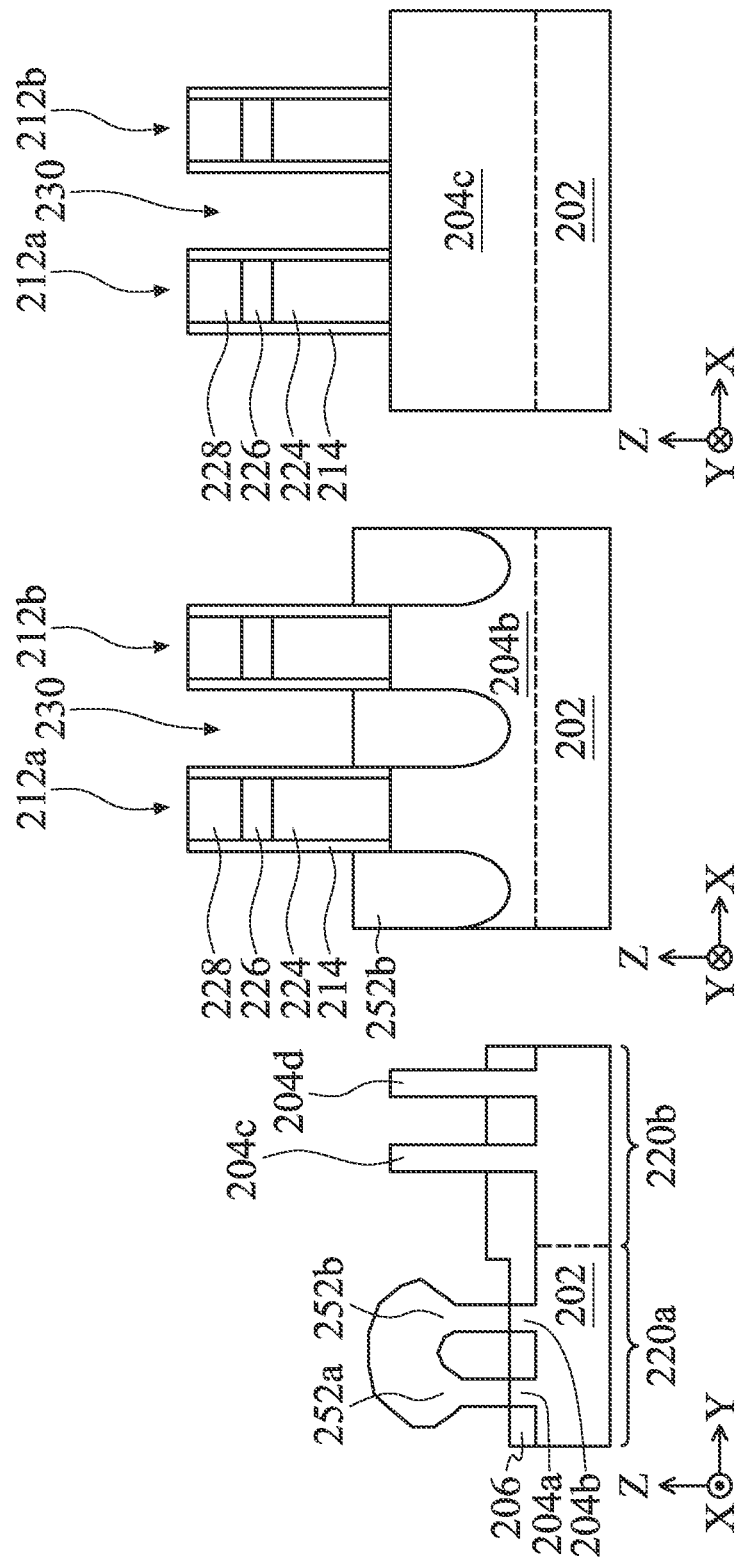

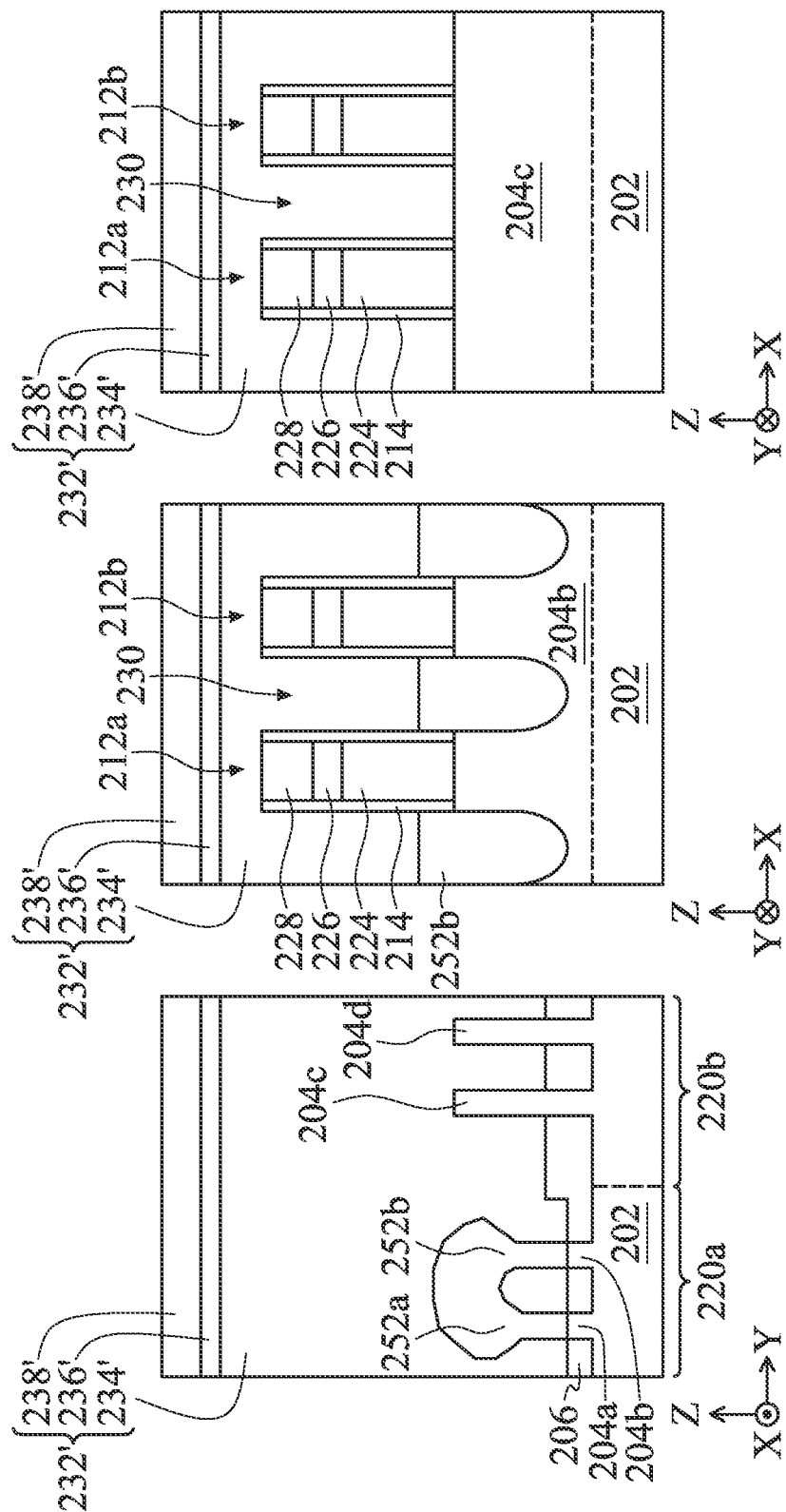

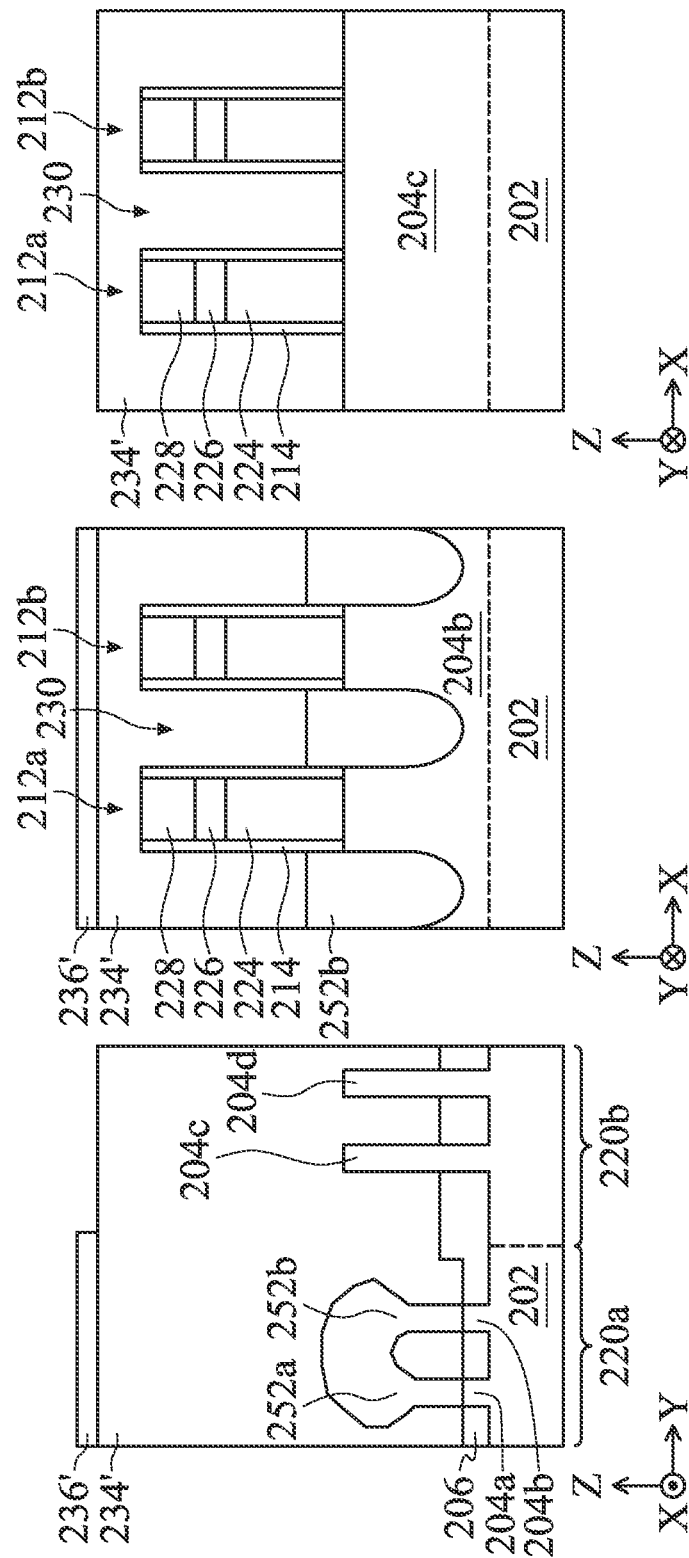

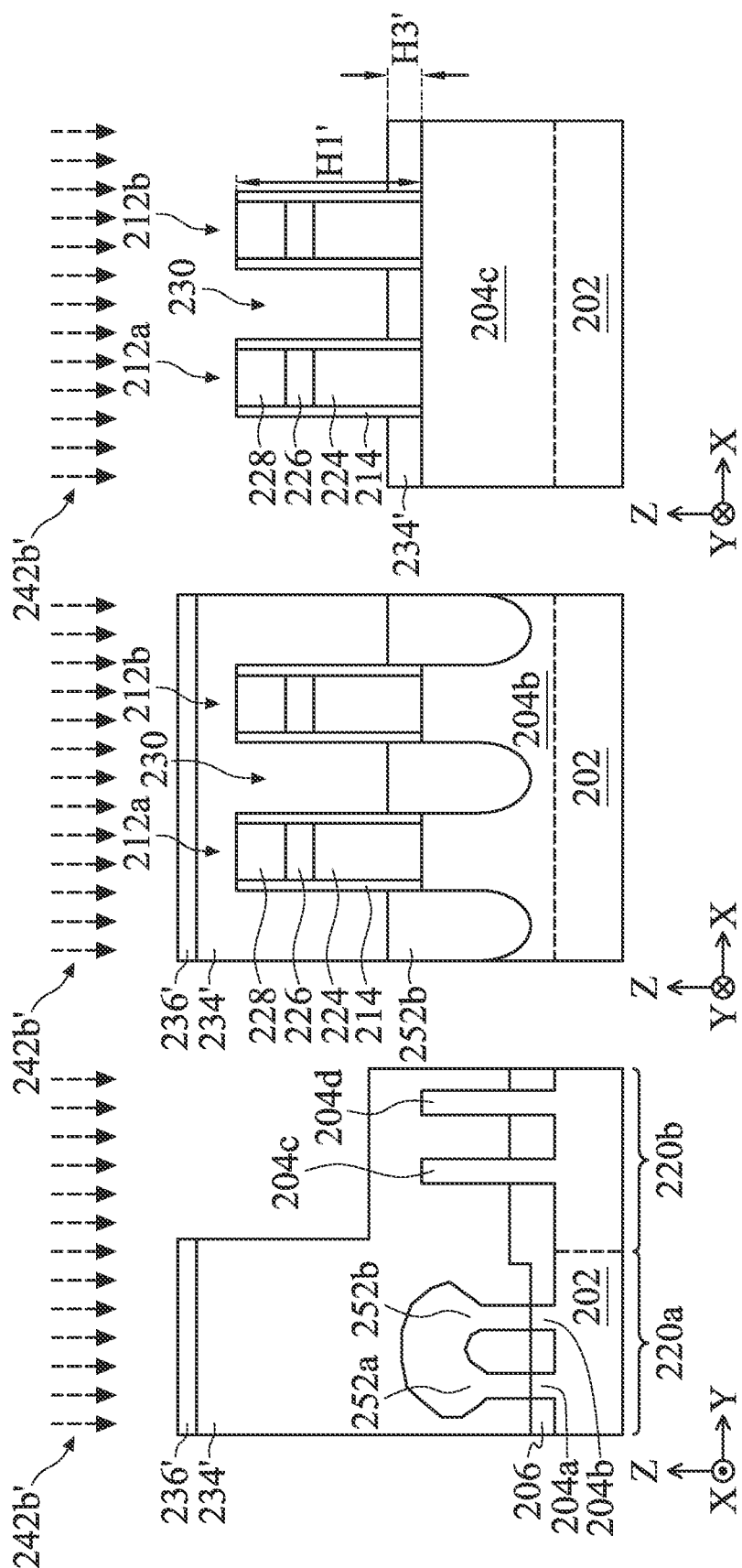

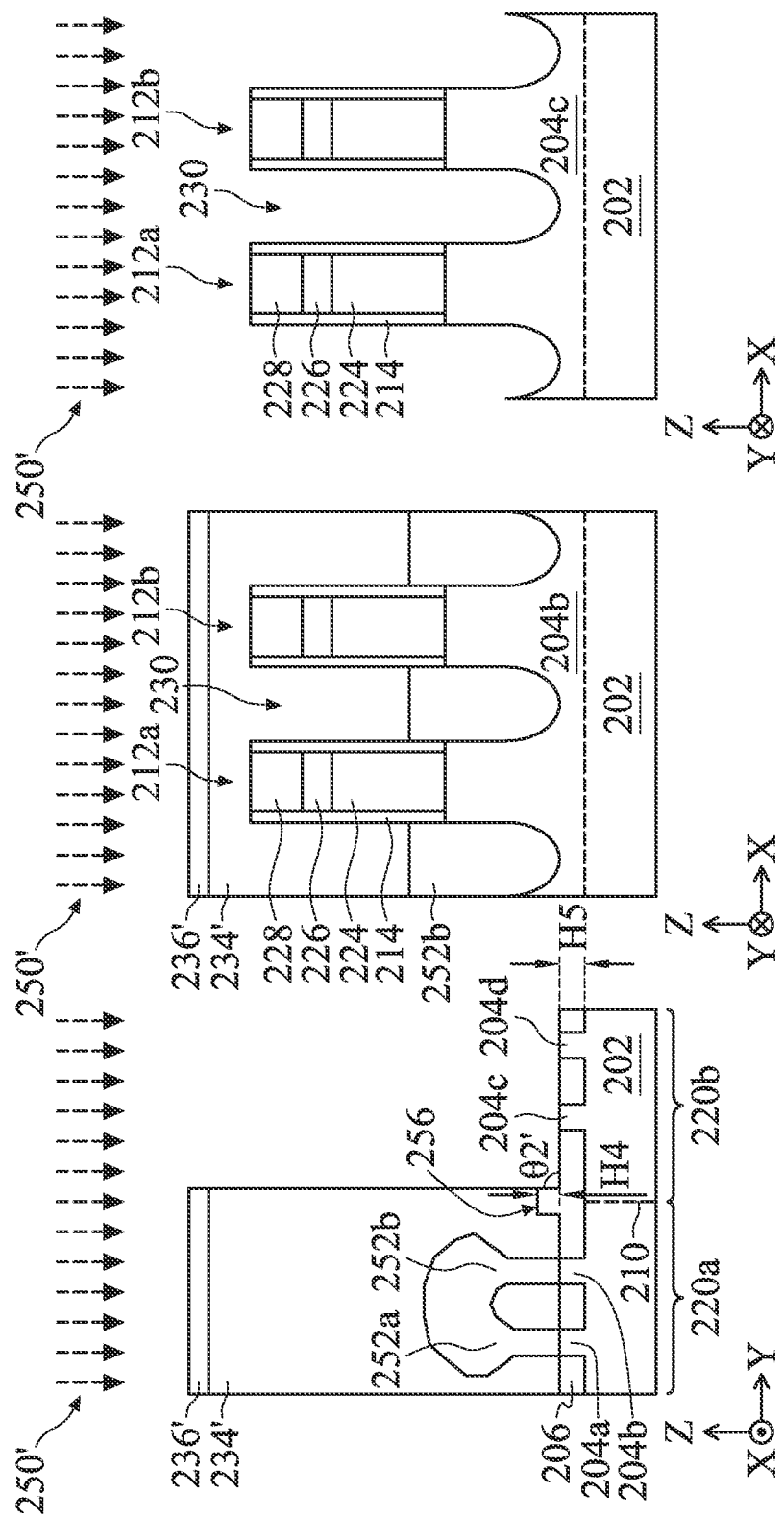

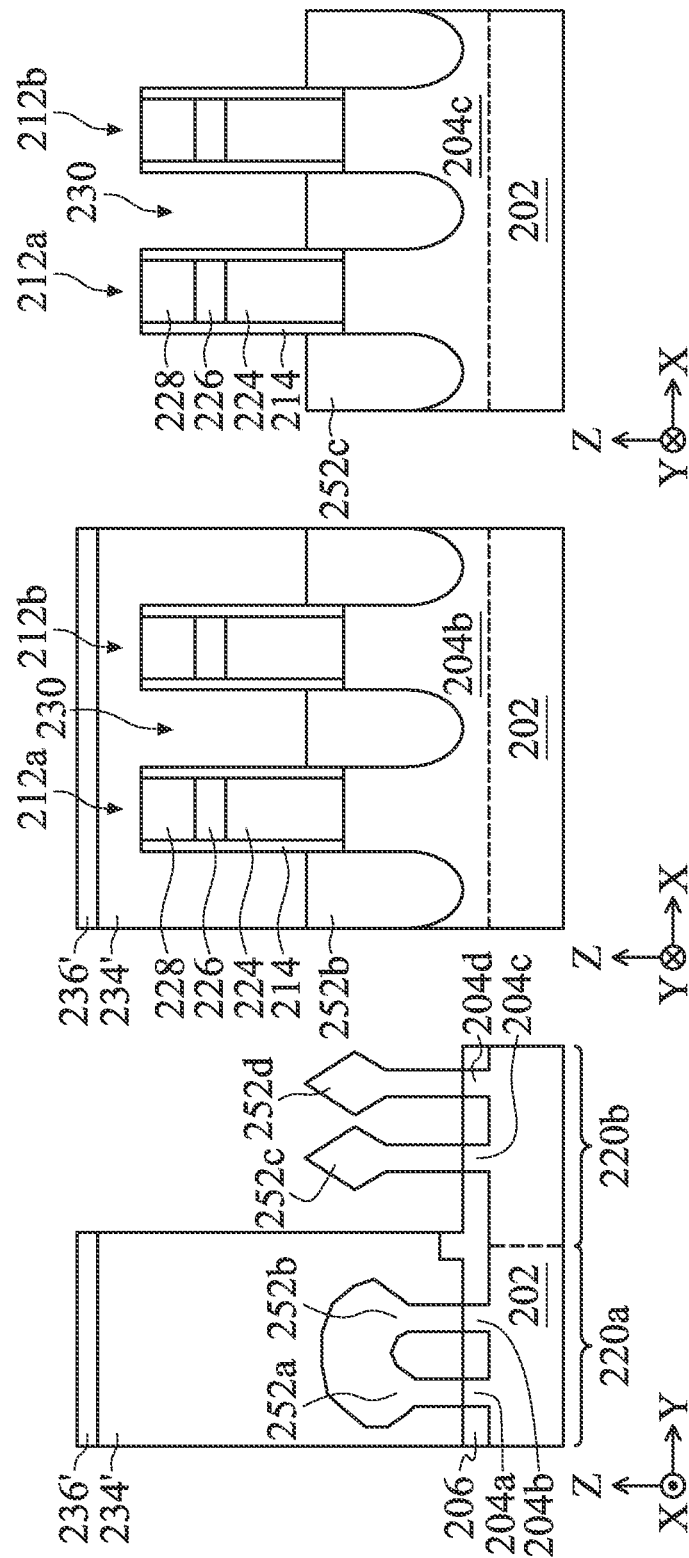

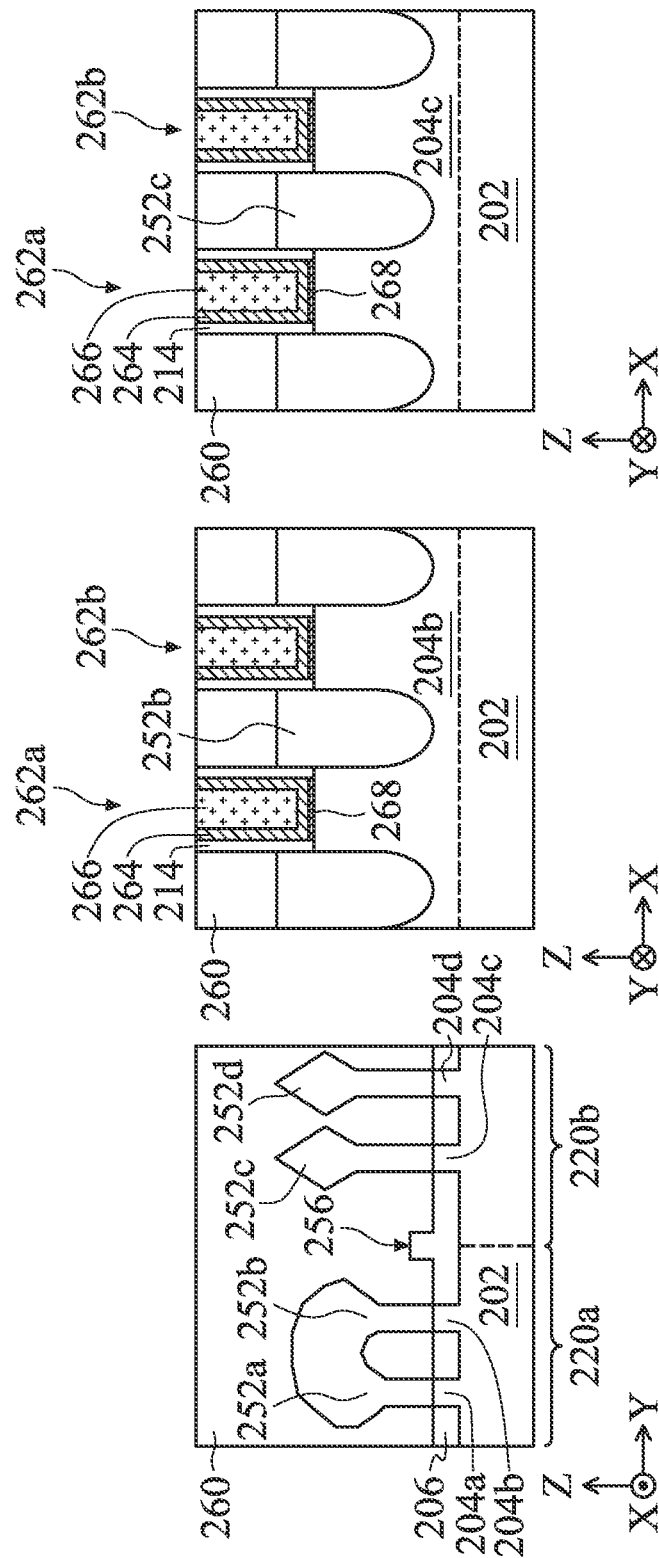

US 11,908,748 B2

SEMICONDUCTOR DEVICES AND METHODS OF FORMING THE SAME

PRIORITY

This is a continuation application of U.S. patent application Ser. No. 17/116,808 filed on Dec. 9, 2020, which claims priority to U.S. Provisional Patent Application Ser. No. 62/978,647 filed on Feb. 19, 2020, the entire disclosures of which are herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, when forming n-type and p-type epitaxial source/drain (S/D) features for small-scaled transistors, such as field effect transistors (FET) having fin-like channel (so-called "FinFETs"), sometimes fins in S/D regions are first recessed. Resist (or photoresist) material is patterned to expose regions for one type of FinFETs (e.g., p-type FinFETs) while covering other regions for another type of FinFETS (e.g., n-type FinFETs). However, there are challenges to implementing such IC fabrication processes, especially with scaled down IC features in advanced process nodes. For example, as the scaling down continues, distance between adjacent gate structures over fins decreases. Accompanying the decreasing in gate distance, it becomes difficult during resist material patterning to remove resist material stacked between gate structures, resulting in remaining resist residue. Particularly, along boundary line between different regions for n-type FinFETs and p-type FinFETs, resist material may form curvy sidewalls. The curvy sidewalls may extend into the regions supposed to be exposed and cover fins near the boundary line, which may cause fin height uniformity issue after fin recess and thus deteriorate device performance. An object of the present disclosure seeks to resolve this issue, among others.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 3B, 3C, 4A, 4B, 4C, 5A, 5B, 5C, 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, 21C, 22A, 22B, 22C, 23A, 23B, 23C, 24A, 24B, 24C, and 25 illustrate cross-sectional views of a semiconductor structure during a fabrication process according to the method of FIGS. 1A-1C, in accordance with some embodiments.

DETAILED DESCRIPTION

Figure 1A:
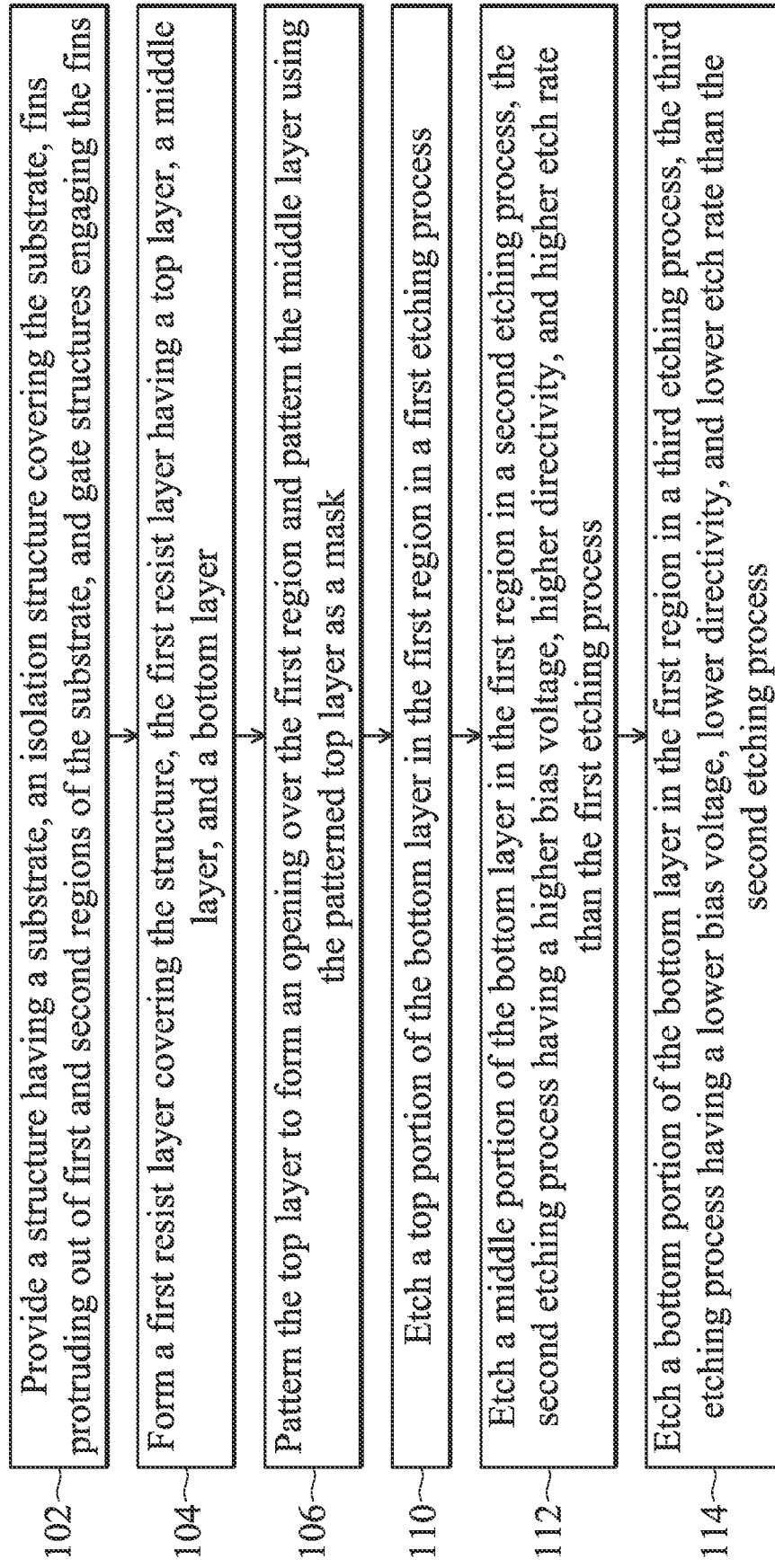
FIGS. 1A, 1B, and 1C show a flow chart of a method for forming semiconductor devices, according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and fabrication methods, and more particularly to fabricating FinFET semiconductor devices with multiple etching steps in removing resist (or photoresist) material in source/drain (S/D) regions stacked between gate structures, which beneficially increases fin height uniformity in subsequent fin recessing process. The fabrication methods also include recessing isolation features surrounding fins, which creates a protruding isolation feature over a boundary line between regions for different types of FinFETs (e.g., n-type FinFET and p-type FinFET). The protruding isolation feature increases isolation between different regions and improves device leakage performance.

Figure 1B:
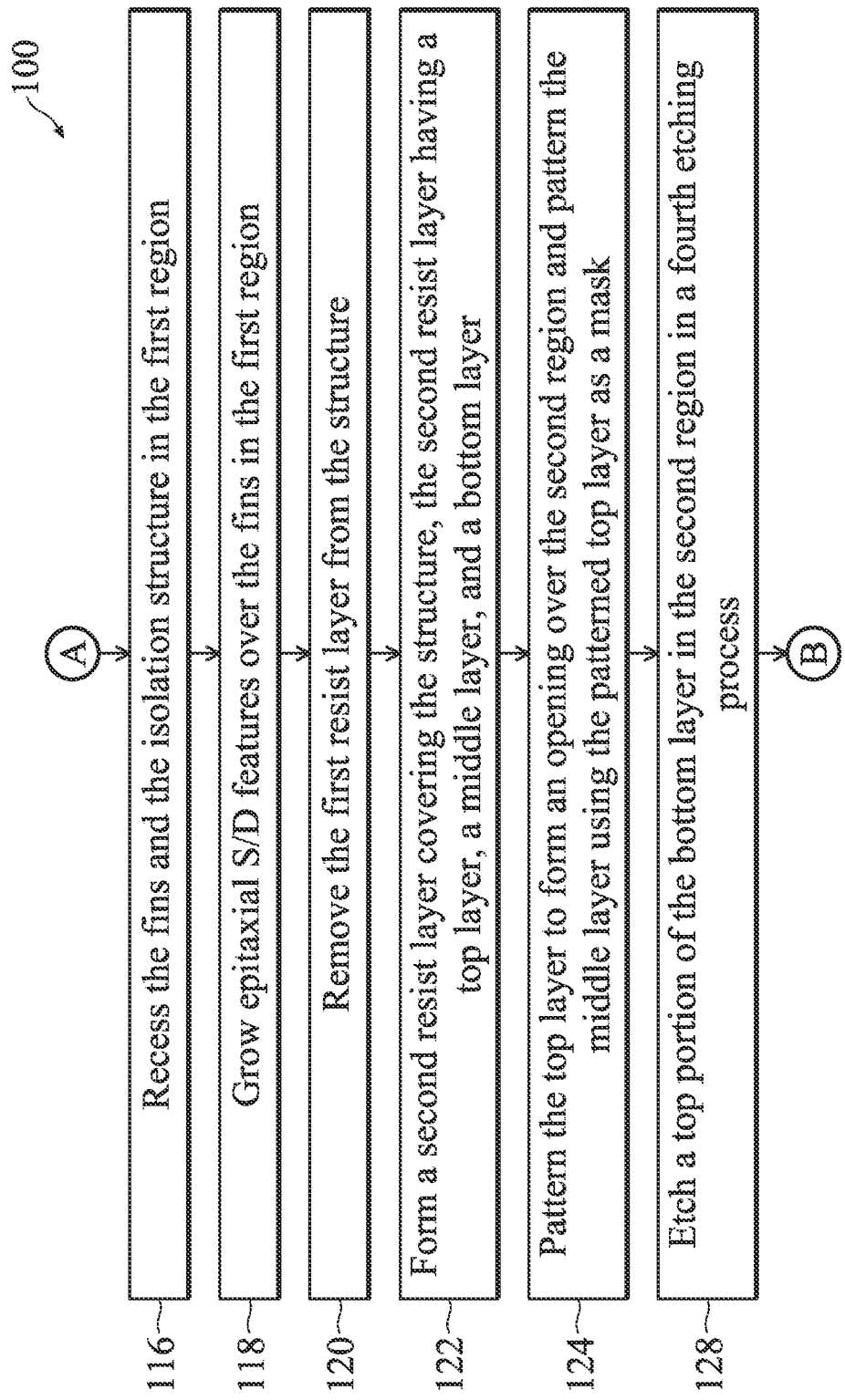
Figure 1C:
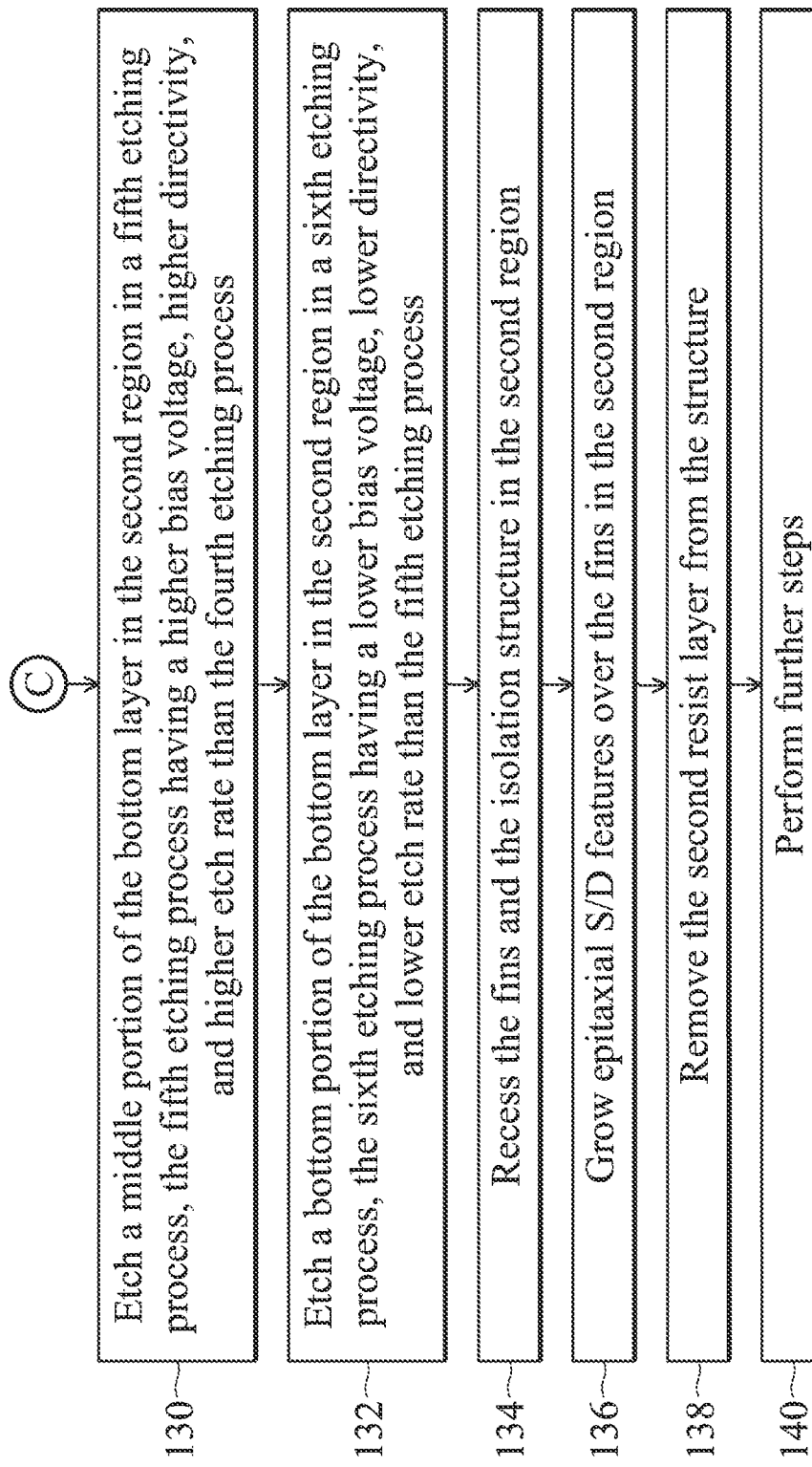
Figure 2:
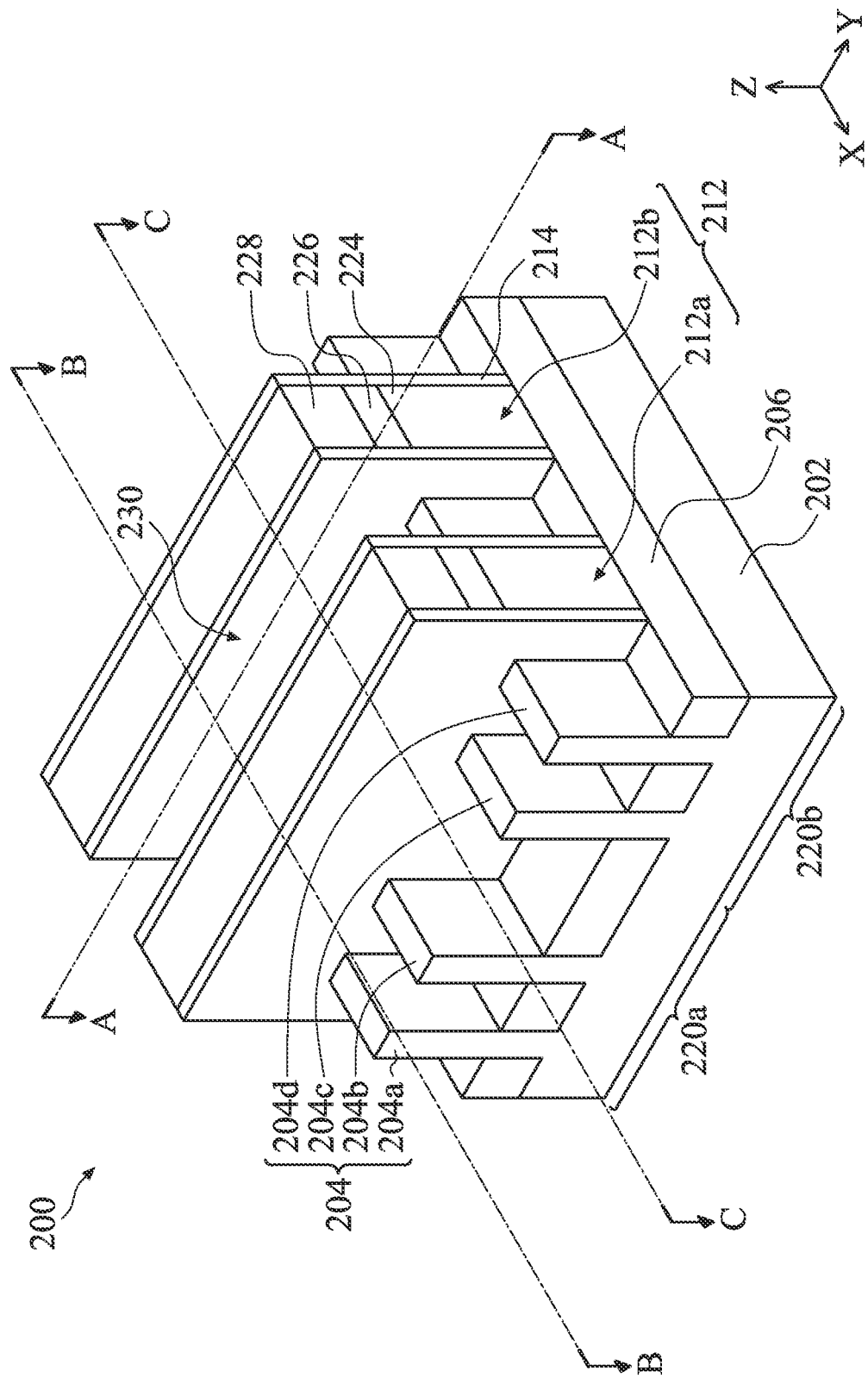
FIG. 2 shows a perspective view of a semiconductor structure during a fabrication process according to the method of FIGS. 1A-1C, in accordance with some embodiments.
Figures 5A, 5B, 5C:
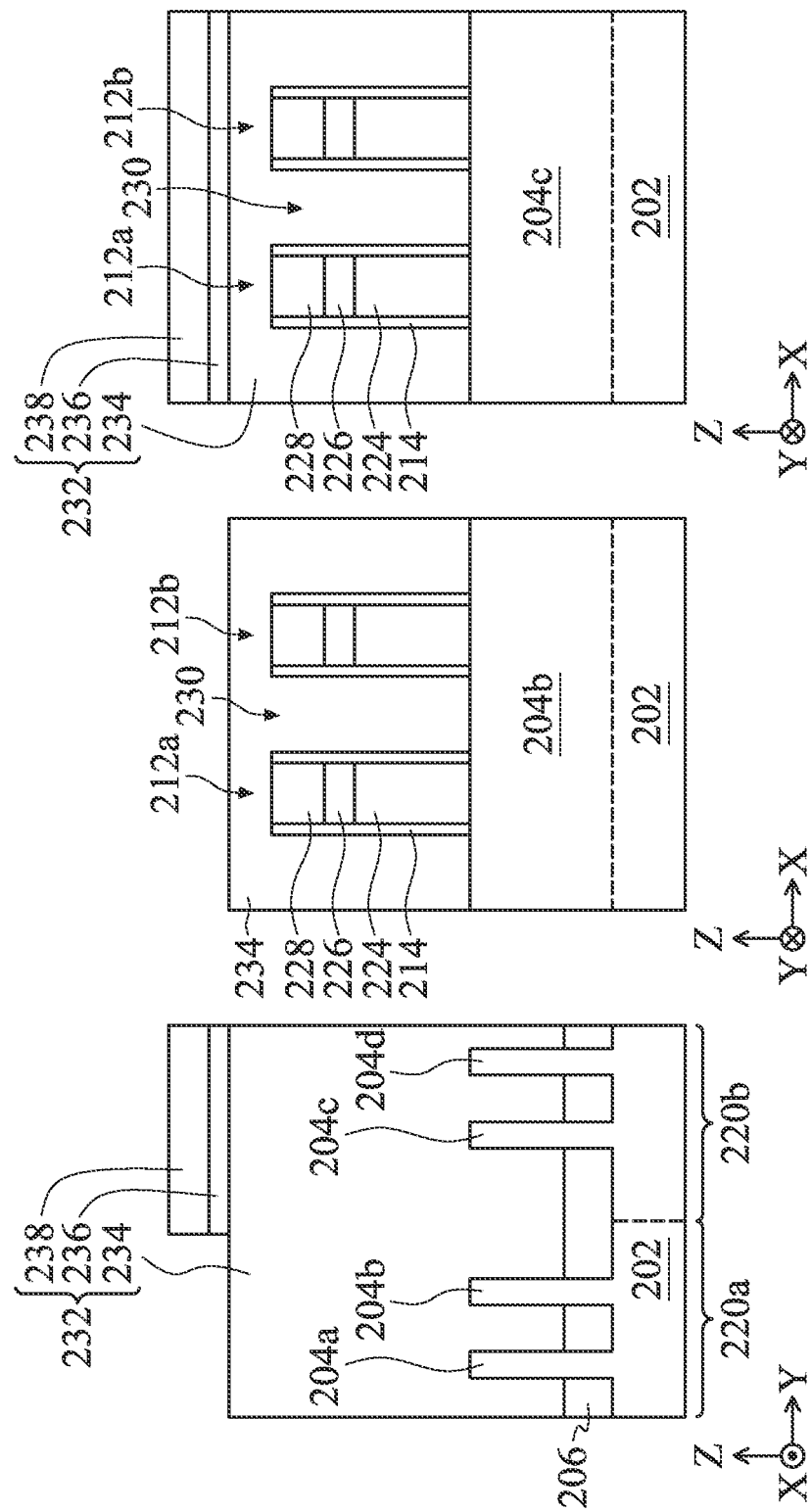
Figures 15A, 15B, 15C:
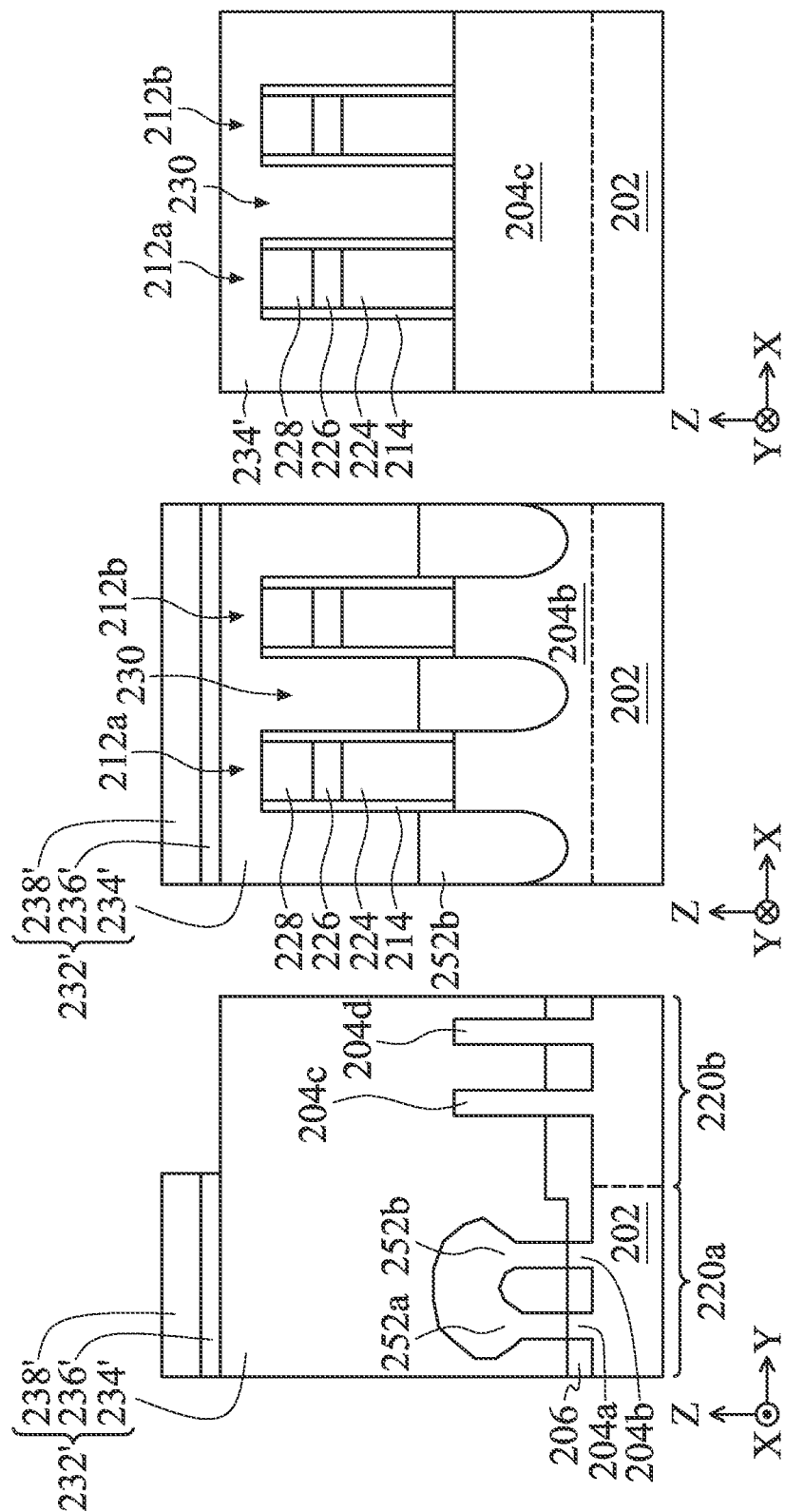

FIGS. 1A, 1B, and 1C illustrate a flow chart of a method 100 for forming a semiconductor device 200 (or device 200) in accordance with some embodiments. The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method. The method 100 is described below in conjunction with FIGS. 2 and 3A-25, which illustrate various cross-sectional views of the device 200 during fabrication steps according to the method 100. Particularly, FIGS. 3A, 4A, 5A, 6A, 7A, 8A, 9A, 10A, 11A, 12A, 13A, 14A, 15A, 16A, 17A, 18A, 19A, 20A, 21A, 22A, 23A, 24A, and 25 are cross-sectional views of a portion of the device 200 along the A-A line as shown in FIG. 2 (a cut between adjacent gate structures in Y-Z plane). FIGS. 3B, 4B, 5B, 6B, 7B, 8B, 9B, 10B, 11B, 12B, 13B, 14B, 15B, 16B, 17B, 18B, 19B, 20B, 21B, 22B, 23B, and 24B are cross-sectional views of a portion of the device 200 along the B-B line as shown in FIG. 2 (a cut along a lengthwise direction of a fin in a PFET region in X-Z plane). FIGS. 3C, 4C, 5C, 6C, 7C, 8C, 9C, 10C, 11C, 12C, 13C, 14C, 15C, 16C, 17C, 18C, 19C, 20C, 21C, 22C, 23C, and 24C are cross-sectional views of a portion of the device 200 along the C-C line as shown in FIG. 2 (a cut along a lengthwise direction of a fin in an NFET region in X-Z plane).

The device 200 is provided for illustration purposes and does not necessarily limit the embodiments of the present disclosure to any number of devices, any number of regions, or any configuration of structures or regions. Furthermore, the device 200 as shown in FIGS. 2 and 3A-25 may be an intermediate device fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Referring to FIGS. 1A, 2, and 3A-3C, at operation 102, the method 100 provides, or is provided with, a device 200 having a substrate 202, fins 204 (including fins 204a, 204b, 204c, and 204d) protruding out of the substrate 202, an isolation feature 206 over the substrate 202 and between the fins 204. Each of the fins 204 includes two S/D regions and a channel region sandwiched between the two S/D regions. The device further includes gate structures 212 (including gate structures 212a and 212b) engaging the channel regions of the fins 204. Gate structures 212 are sometimes referred to as dummy gate structures or dummy gate stacks in a replacement gate process. The device further includes a gate spacer 214 on sidewalls of the gate structures 212. The various features (or components) of the device 200 are further described below.

The substrate 202 is a silicon (Si) substrate in the present embodiment. In alternative embodiments, the substrate 202 includes other elementary semiconductors such as germanium (Ge); a compound semiconductor such as silicon carbide (SiC), gallium arsenide (GaAs), indium arsenide (InAs), and indium phosphide (InP); or an alloy semiconductor, such as silicon germanium carbide (SiGeC), gallium arsenic phosphide (GaAsP), and gallium indium phosphide (GaInP). In embodiments, the substrate 202 may include silicon on insulator (SOI) substrate, be strained and/or stressed for performance enhancement, include epitaxial regions, doped regions, and/or include other suitable features and layers.

The device 200 includes two regions 220a and 220b (with a boundary line 210 represented by a dotted line in FIG. 3A). In the present embodiment, the region 220a is for forming one or more p-type FinFET devices, and the region 220b is for forming one or more n-type FinFET devices. Therefore, the region 220a is also referred to as the PFET region 220a, and the region 220b is also referred to as the NFET region 220b. The PFET region 220a and NFET region 220b each includes one or more fins 204 separated by the isolation feature 206, such as the fins 204a/204b in the PFET region 220a and the fins 204c/204d in the NFET region 220b. It is understood that the present disclosure is not limited to any particular number of fins and regions, or to any particular device configurations. For example, though the device 200 as illustrated is a FinFET device, the present disclosure may also provide embodiments for fabricating planar FET devices or gate-all-around (GAA) FET devices. It is also understood that the device 200 may alternatively have n-type FinFETs to form in the region 220a and p-type FinFETs to form in the region 220b.

The fins 204 are oriented lengthwise along X direction and spaced from each other along Y direction perpendicular to the X direction. Each of the fins 204 may be designed for forming n-type FinFETs or p-type FinFETs depending on respective regions therein. The fins 204 may be patterned by any suitable method. For example, the fins 204 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the fins 204. For example, the masking element may be used for etching recesses into the substrate 202, leaving the fins 204 on the substrate 202. The etching process may include dry etching, wet etching, reactive ion etching (RIE), and/or other suitable processes.

The isolation feature 206 may include silicon oxide ($SiO_2$), silicon nitride (SiN), silicon oxynitride (SiON), fluoride-doped silicate glass (FSG), a low-k dielectric material, and/or other suitable insulating material. The isolation feature 206 may be shallow trench isolation (STI) features. In an embodiment, the isolation feature 206 is formed by etching trenches in the substrate 202 (e.g., as part of the process of forming the fins 204), filling the trenches with an insulating material, and performing a chemical mechanical planarization (CMP) process to the substrate 202 including the insulating material. Other types of isolation feature may also be suitable, such as field oxide and LOCal Oxidation of Silicon (LOCOS).

The gate structures 212 are oriented lengthwise along the Y direction and spaced from each other along the X direction. The gate structures 212 engage the fins 204a, 204b, 204c, and 204d in their respective channel regions to thereby form FinFETs. Each of the gate structures 212a and 212b is a multi-layer structure. In an embodiment, the gate structures 212a and 212b are placeholders (so-called "dummy gates" or "temporary gates") for high-k metal gates, wherein one or more of the layers in the gate structures 212a and 212b are replaced in a later process. For example, each of the gate structures 212a and 212b may include an interfacial layer (not shown), an electrode layer 224 over the interfacial layer, and two hard mask layers 226 and 228.

The interfacial layer may include a dielectric material such as silicon oxide layer (e.g., $SiO_2$) or silicon oxynitride (e.g., SiON), and may be formed by chemical oxidation, thermal oxidation, atomic layer deposition (ALD), CVD, and/or other suitable methods. The gate electrode 224 may include poly-crystalline silicon (poly-Si) and may be formed by suitable deposition processes such as low-pressure chemical vapor deposition (LPCVD) and plasma-enhanced CVD (PECVD). Each of the hard mask layers 226 and 228 may include one or more layers of dielectric material such as silicon oxide and/or silicon nitride, and may be formed by CVD or other suitable methods. The various layers in the gate structures 212 may be patterned by photolithography and etching processes. The gate spacers 214 may comprise a dielectric material, such as silicon oxide, silicon nitride, silicon oxynitride, silicon carbide, other dielectric material, or combinations thereof, and may comprise one or multiple layers of material. The gate spacers 214 may be formed by depositing a spacer material as a blanket over the isolation feature 206, the fins 204, and the gate structures 212. Then the spacer material is etched by an anisotropic etching process to expose the isolation feature 206, the hard mask layer 228, and the fins 204. Portions of the spacer material on the sidewalls of the gate structures 212 become the gate spacers 214. Adjacent gate spacers 214 provide trenches 230 that expose the fins 204 in the S/D regions.

Subsequently, the method 100 proceeds to operations that cover NFET region 220b with a resist (or photoresist) layer and expose the fins 204a and 204b in the PFET region 220a for fin recess and epitaxial S/D feature growth.

Referring to FIGS. 1A and 4A-4C, at operation 104, the method 100 deposits a resist layer 232 over the device 200 covering both the regions 220a and 220b and filling the trench 230 between adjacent gate structures 212a and 212b. In the illustrated embodiment, the resist layer 232 is a tri-layer resist that includes a bottom layer 234, a middle layer 236, and a relatively thin top photoresist layer 238. As the limits of photolithography processes are reached by advanced semiconductor manufacturing processes, the need for thinner top photoresist layers has arisen to achieve smaller process windows. However, a photoresist layer alone may not be sufficiently robust to support the etching of target layers. A tri-layer resist provides a relatively thin top photoresist layer 238. The tri-layer resist 232 further includes the middle layer 236, which may include silicon-containing photoresist materials to increase the selectivity of bottom layer 234. Tri-layer resist 232 further includes the bottom layer 234, which may comprise a photoresist spin-on material. Thus, tri-layer resist 232 allows for the robust patterning of underlying layers while still providing a relatively thin top photoresist layer 238. In some embodiments, the bottom layer 234 may include a carbon rich polymer material (e.g., $C_xH_yO_z$), the middle layer 236 may include a silicon rich polymer material (e.g., $SiC_xH_yO_z$), and the top photoresist layer 238 may include a carbon rich polymer material (e.g., $C_xH_yO_z$) with a photosensitive component that undergoes a property change when exposed to radiation. It is understood that in other embodiments, one or more layers of the tri-layer resist may be omitted (e.g., without the middle layer 236) and that additional layers may be provided as a part of the tri-layer resist. In the illustrated embodiment, the bottom layer 234 is higher than the gate structures 212.

Referring to FIGS. 1A and 5A-5C, at operation 106, the method 100 patterns the top photoresist layer 238 to form an opening above the PFET region 220a. The patterning of top photoresist layer 238 may be achieved, for example, by using an immersion photolithography system to expose portions of the top photoresist layer 238 and developing the exposed or unexposed portions depending on whether a positive or negative photoresist is used. The method 100 at operation 106 also etches the middle layer 236 through the openings in the top photoresist layer 238. In this manner, the top photoresist layer 238 serves as an etching mask limiting the etching process in the PFET region 220a. Operation 106 may include any suitable etching process including wet etching, dry etching, reactive ion etching, ashing, and/or other suitable technique. The top photoresist layer 238 may be stripped from the NFET region 220b following the patterning of the middle layer 236, as shown in FIGS. 6A-6C.

Referring to FIGS. 1A and 7A-7C, at operation 110, the method 100 etches a top portion of the bottom layer 234 through the openings in the middle layer 236. In this manner, the middle layer 236 serves as an etching mask limiting the etching process in the PFET region 220a. Conventionally, the bottom layer 234 is removed from the PFET region 220a in one etching step, such as wet etching or dry etching, to expose the fins thereunder. However, with scaled down IC features in advanced process nodes, the distance between adjacent gate structures 212a and 212b decreases, resulting in the trench 230 with a high aspect ratio. It becomes difficult to remove resist material of the bottom layer 238 completely from a high aspect ratio trench. Particularly, the sidewall of the bottom layer 234 along the boundary line 210, denoted by a dotted line 240 in FIG. 7A, may become curvy. The curvy sidewall 240 may partially cover fins near the boundary line 210, such as the fin 204b in the illustrated embodiment, resulting in uneven fin heights after subsequent fin recess process. Thus, there is a need to form a substantially straight sidewall 240 after the removal of the bottom layer 234. One possible way to achieve this is to increase etching strength (i.e., to increase etching rate or etching directivity) towards the bottom layer 234 during the etching process, such as by increasing bias voltage in a plasma etching process. However, a stronger etching process for a long duration would introduce other issues. For example, a strong plasma etching may cause damages to gate structures and/or fin tops. As explained in greater detail below, the method 100 includes multiple etching steps to remove the bottom layer 234 from the PFET region 220a instead of one single etching step. The multiple etching steps employ weaker etching processes combined with a stronger etching process in order to reduce the stronger etching process to a moderate duration, thereby protecting other semiconductor structures thereunder. The multiple etching steps are in-situ in some embodiments.

Still referring to FIGS. 7A-7C, operation 110 recesses the bottom layer 234 in the PFET region 220a. Operation 110 may include wet etching, dry etching, reactive ion etching, ashing, and/or other suitable technique. In one embodiment, operation 110 includes a wet etching process with a suitable etching solution, such as a hydrofluoric acid (HF) based solution, a sulfuric acid ($H_2SO_4$) based solution, a hydrochloric (HCl) acid based solution, an ammonium hydroxide ($NH_4OH$) based solution, other suitable etching solution, or combinations thereof. In another embodiment, operation 110 includes a dry etching process. In furtherance of the embodiment, operation 110 includes a plasma etching process 242a. The etchant may be a plasma containing a sulfur-containing compound, such as sulfur dioxide ($SO_2$) mixed with an inert gas selected from He, Ar, Xe, Kr, Ne, and combinations thereof. In a particular example, the plasma etching process is applied with a $SO_2$/He flow rate between 0 and about 500 sccm, under a gas pressure between 0 and about 60 mtorr, a bias voltage between 0 and about 200 V, at a frequency from about 12 MHz to about 14 MHz, at a temperature between about 50° C. and about 60° C., for a duration between about 50 seconds to about 80 seconds.

In some embodiments, the bottom layer 234 is recessed below the gate structures 212 for a distance denoted as H2, as shown in FIG. 7B. In various embodiments, a ratio of the distance H2 to a depth of the trench 230 denoted as H1 (measured from fin top to gate structure top) ranges from about 1:4 to about 1:2. If H2:H1 is lower than 1:4, it means the remaining bottom layer 234 in the trench 230 is still high, which requires a subsequent stronger etching process for a longer duration. As discussed above, a stronger etching process with long duration may cause damages to the gate structure and the gate spacer already exposed under the etchant. If H2:H1 is larger than 1:2, resist material residue may start accumulating on top portions of the sidewalls of the trench 230 due to the relatively weaker etching process used in operation 110.

Referring to FIGS. 1A and 8A-8C, at operation 112, the method 100 etches a middle portion of the bottom layer 234 through the openings in the middle layer 236. Compared with operation 110, the etching process in operation 112 is relatively stronger, such as with larger etching rate and larger etching directivity (e.g., at least 2 times larger). In some embodiments, operation 112 includes a dry etching process. In furtherance of the embodiments, operation 112 includes a plasma etching process 242b. Various etching parameters can be tuned to strengthen the plasma etching process 242b, such as etchant composition, etching temperature, etching solution concentration, etching time, etching pressure, source power, RF bias voltage, RF bias power, etchant flow rate, other suitable etching parameters, or combinations thereof. In a particular example, the plasma etching process 242b has the same etchant, flow rate, gas pressure, and temperature as the plasma etching process 242a, but with a higher bias voltage between about 300 V to about 800 V, at a slower frequency such as between about 1 MHz to about 2 MHz, for a shorter duration such as between about 10 seconds to about 20 seconds. In some embodiments, the plasma etching process 242b uses a different etchant from the plasma etching process 242a, such as a plasma containing a mixture of $CF_4$ and $Cl_2$ (i.e., $CF_4/Cl_2$ plasma) other than a sulfur-containing compound.

In some embodiments, after operation 112, a portion of the bottom layer 234 remains above the fin top for a height denoted as H3, as shown in FIG. 8B. In various embodiments, a ratio of the height H3 to the trench depth H1 (measured from fin top to gate structure top) ranges from about 1:4 to about 1:2. If H3:H1 is lower than 1:4, the remaining bottom layer 234 over the fin top may be too thin to protect fins from strong plasma bombardment. If H3:H1 is larger than 1:2, resist material residue may remain on bottom portions of the sidewalls of the trench 230 due to a relatively weaker etching process following operation 112. In some alternative embodiments, the bottom layer 234 is recessed below the fins 204a and 204b, as shown in FIGS. 9A-9C.

Referring to FIGS. 1A and 10A-10C, at operation 114, the method 100 etches a bottom portion of the bottom layer 234 and completely removes the bottom layer 234 from the PFET region 220a, thereby exposing the isolation feature 206 and the fins 204a and 204b in the S/D regions. Compared with operation 112, the etching process in operation 114 is relatively weaker, such as with less etching rate and less etching directivity (e.g., substantially the same with that of operation 110). In some embodiments, the etching process in operation 114 is further weaker, such as with less etching rate and less etching directivity, than the etching process in operation 110. In some other embodiments, the etching process in operation 114 is weaker than the etching process in operation 112 but stronger than the etching process in operation 110. In one embodiment, operation 114 includes a wet etching process with a suitable etching solution, such as a hydrofluoric acid (HF) based solution, a sulfuric acid ($H_2SO_4$) based solution, a hydrochloric (HCl) acid based solution, an ammonium hydroxide ($NH_4OH$) based solution, other suitable etching solution, or combinations thereof. In some embodiments, operation 114 includes a dry etching process. In furtherance of the embodiments, operation 114 includes a plasma etching process 242c. Various etching parameters can be tuned to weaken the plasma etching process 242c, such as etchant composition, etching temperature, etching solution concentration, etching time, etching pressure, source power, RF bias voltage, RF bias power, etchant flow rate, other suitable etching parameters, or combinations thereof. In a particular example, the plasma etching process 242c has the same etchant, flow rate, gas pressure, bias voltage, frequency, and temperature as the plasma etching process 242a, which has smaller bias voltage and higher frequency than the plasma etching process 242b, but for a duration longer than that of the plasma etching process 242b but shorter than that of the plasma etching process 242a, such as between about 15 seconds to about 30 seconds.

Compare with the curvy dotted line 240 in FIG. 8A, the sidewall 246 of the bottom layer 234 is straight and substantially perpendicular to a top surface of the isolation feature 206 (or a top surface of the substrate 202). Here, the term "substantially perpendicular" refers to an angle θ1 formed between the sidewall 246 and the top surface of the isolation feature 206 (or the top surface of the substrate 202) being in a range from about 88 degrees to about 95 degrees, such as from about 90 degrees to about 93 degrees in some examples.

Referring to FIGS. 1B and 11A-11C, at operation 116, the method 100 recesses the fins 204a and 204b in the S/D regions in an etching process 250. In the illustrated embodiment, the method 100 at operation 116 also recesses the isolation feature 206 in the PFET region 220a, resulting in a step profile. A sidewall of the step profile facing the PFET region 220a is substantially perpendicular to a top surface of the isolation feature 206, such that an angle θ2 formed between the sidewall and the top surface of the isolation feature 206 is in a range from about 88 degrees to about 95 degrees, such as from about 90 degrees to about 93 degrees in some examples. The etching process 250 may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to recess the fins 204a and 204b and the isolation feature 206 may be suitable. In the illustrated embodiment, a top surface of the isolation feature 206 in the PFET region 220a remains flushed with top surfaces of the fins 204a and 204b.

Referring to FIGS. 1B and 12A-12C, at operation 118, the method 100 forms epitaxial S/D features 252a and 252b (collectively denoted as epitaxial S/D features 252) over the fins 204a and 204b, respectively. The semiconductor material of epitaxial S/D features 252 is raised above the top surface of the fins 204. The epitaxial S/D features 252 in the PFET region 220a may include epitaxially grown silicon germanium (SiGe). The epitaxial S/D features 252 in the PFET region 220a may further be doped with proper dopants suitable for p-type devices. For example, the epitaxial S/D features 252a and 252b may be doped with a p-type dopant such as boron (B) or indium (In). Adjacent epitaxial S/D features 252a and 252b may be separated from each other (not shown) or may merge together in some embodiments, such as shown in FIG. 12A.

Referring to FIGS. 1B and 13A-13C, at operation 120, the method 100 removes the resist layer 232 (e.g., bottom layer 234, middle layer 236, and/or top photoresist layer 238 if any) from the device 200. Operation 120 may include any suitable etching process including wet etching, dry etching, reactive ion etching, ashing, and/or other suitable technique. After operation 120, the device 200 in the NFET region 220b is also exposed.

Subsequently, the method 100 proceeds to operations that cover PFET region 220a with a resist (or photoresist) layer and expose the fins 204c and 204d in the NFET region 220b for fin recess and epitaxial S/D feature growth.

Referring to FIGS. 1B and 14A-14C, at operation 122, the method 100 deposits a resist layer 232' over the device 200 covering both the regions 220a and 220b and filling the trench 230 between adjacent gate structures 212a and 212b. In the illustrated embodiment, the resist layer 232' is a tri-layer resist that includes a bottom layer 234', a middle layer 236', and a relatively thin top photoresist layer 238'. The resist layer 232' is substantially similar to what has been discussed above in association with the resist layer 232, in some embodiments.

Referring to FIGS. 1B and 15A-15C, at operation 124, the method 100 patterns the top photoresist layer 238' to form an opening above the NFET region 220b. The patterning of top photoresist layer 238' may be achieved, for example, by using an immersion photolithography system to expose portions of top photoresist layer 238' and developing the exposed or unexposed portions depending on whether a positive or negative photoresist is used. The method 100 at operation 124 also etches the middle layer 236' through the openings in the top photoresist layer 238'. In this manner, the top photoresist layer 238' serves as an etching mask limiting the etching process in the NFET region 220b. Operation 124 may include any suitable etching process including wet etching, dry etching, reactive ion etching, ashing, and/or other suitable technique. The top photoresist layer 238' may be stripped from the PFET region 220a following the patterning of the middle layer 236', as shown in FIGS. 16A-16C.

Referring to FIGS. 1A and 17A-17C, at operation 128, the method 100 etches a top portion of the bottom layer 234' through the openings in the middle layer 236'. In this manner, the middle layer 236' serves as an etching mask limiting the etching process in the NFET region 220b. As explained in greater detail below, the method 100 includes multiple etching steps to remove the bottom layer 234' from the NFET region 220b instead of in one etching step. The multiple etching steps employ weaker etching processes combined with a stronger etching process in order to shrink the stronger etching process to a moderate duration, thereby protecting other semiconductor structures thereunder. The multiple etching steps are in-situ in some embodiments.

Figures 17A, 17B, 17C:
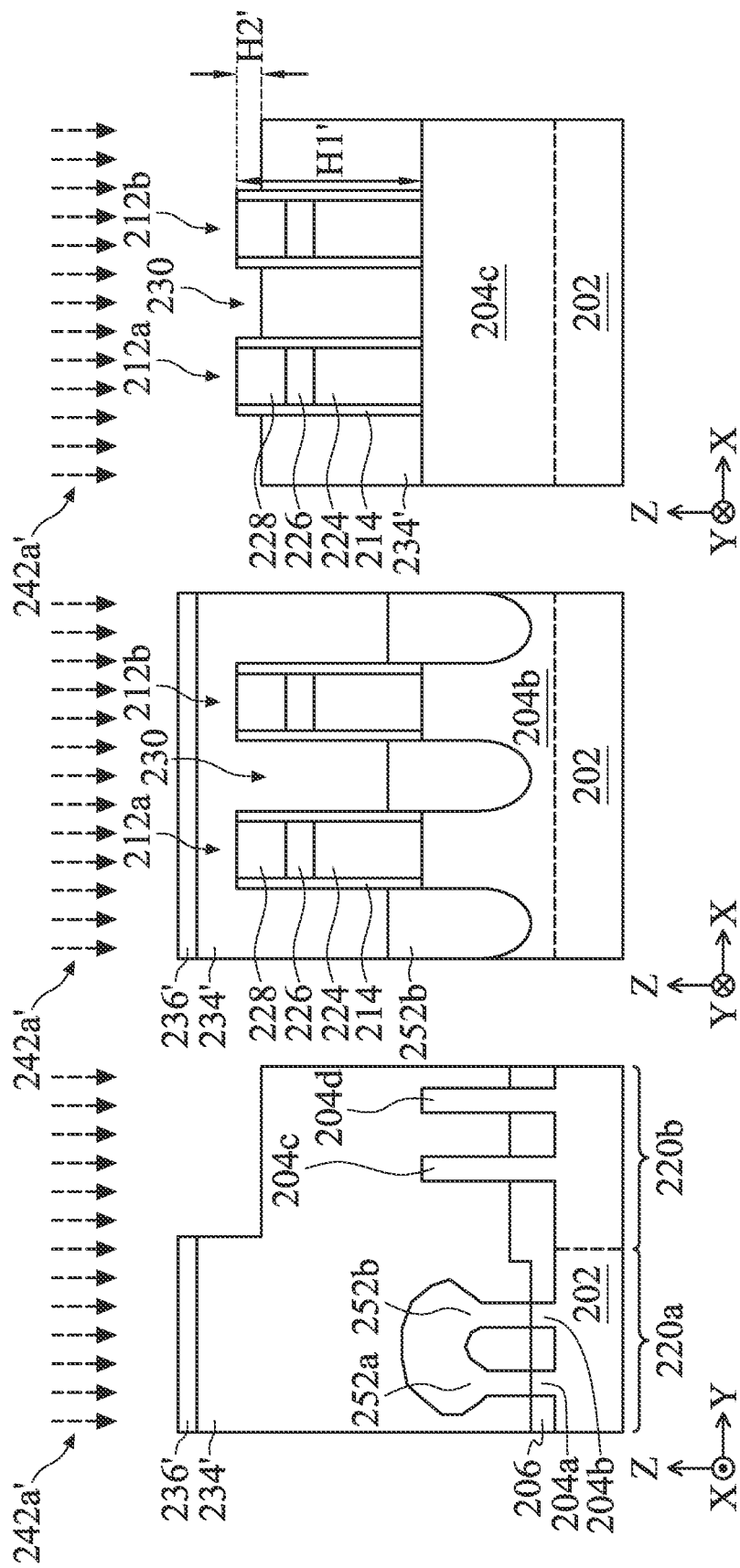

Still referring to FIGS. 17A-17C, operation 128 recesses the bottom layer 234' in the NFET region 220b. Operation 128 may include wet etching, dry etching, reactive ion etching, ashing, and/or other suitable technique. In one embodiment, operation 128 includes a wet etching process with a suitable etching solution, such as a hydrofluoric acid (HF) based solution, a sulfuric acid ($H_2SO_4$) based solution, a hydrochloric (HCl) acid based solution, an ammonium hydroxide ($NH_4OH$) based solution, other suitable etching solution, or combinations thereof. In another embodiment, operation 128 includes a dry etching process. In furtherance of the embodiment, operation 128 includes a plasma etching process 242'a. The etchant may be a plasma containing a sulfur-containing compound, such as sulfur dioxide ($SO_2$) mixed with an inert gas selected from He, Ar, Xe, Kr, Ne, and combinations thereof. In a particular example, the plasma etching process is applied with a $SO_2$/He flow rate between 0 and about 500 sccm, under a gas pressure between 0 and about 60 mtorr, a bias voltage between 0 and about 200 V, at a frequency from about 12 MHz to about 14 MHz, at a temperature between about 50° C. and about 60° C., for a duration between about 50 seconds to about 80 seconds.

In some embodiments, the bottom layer 234' is recessed below the gate structures 212 for a distance denoted as H2', as shown in FIG. 17C. In various embodiments, a ratio of the distance H2' to a depth of the trench 230 denoted as H1' (measured from fin top to gate structure top) ranges from about 1:4 to about 1:2. If H2':H1' is lower than 1:4, it means the remaining bottom layer 234' in the trench 230 is still high, which requires a subsequent stronger etching process for a longer duration. As discussed above, a stronger etching process with long duration may cause damages to the gate structure already exposed under the etchant. If H2':H1' is larger than 1:2, resist material residue may start accumulating on top portions of the sidewalls of the trench 230 due to the relatively weaker etching process used in operation 128.

Referring to FIGS. 1C and 18A-18C, at operation 130, the method 100 etches a middle portion of the bottom layer 234' through the openings in the middle layer 236'. Compared with operation 128, the etching process in operation 130 is relatively stronger, such as with larger etching rate and larger etching directivity (e.g., at least 2 times larger). In some embodiments, operation 130 includes a dry etching process. In furtherance of the embodiments, operation 130 includes a plasma etching process 242b'. Various etching parameters can be tuned to strengthen the plasma etching process 242b', such as etchant composition, etching temperature, etching solution concentration, etching time, etching pressure, source power, RF bias voltage, RF bias power, etchant flow rate, other suitable etching parameters, or combinations thereof. In a particular example, the plasma etching process 242b' has the same etchant, flow rate, gas pressure, and temperature as the plasma etching process 242a', but with a higher bias voltage between about 300 V to about 800 V, at a slower frequency such as between about 1 MHz to about 2 MHz, for a shorter duration such as between about 10 seconds to about 20 seconds. In some embodiments, the plasma etching process 242b' uses a different etchant from the plasma etching process 242a', such as a plasma containing a mixture of $CF_4$ and $Cl_2$ (i.e., $CF_4/Cl_2$ plasma) other than a sulfur-containing compound.

Figures 19A, 19B, 19C:
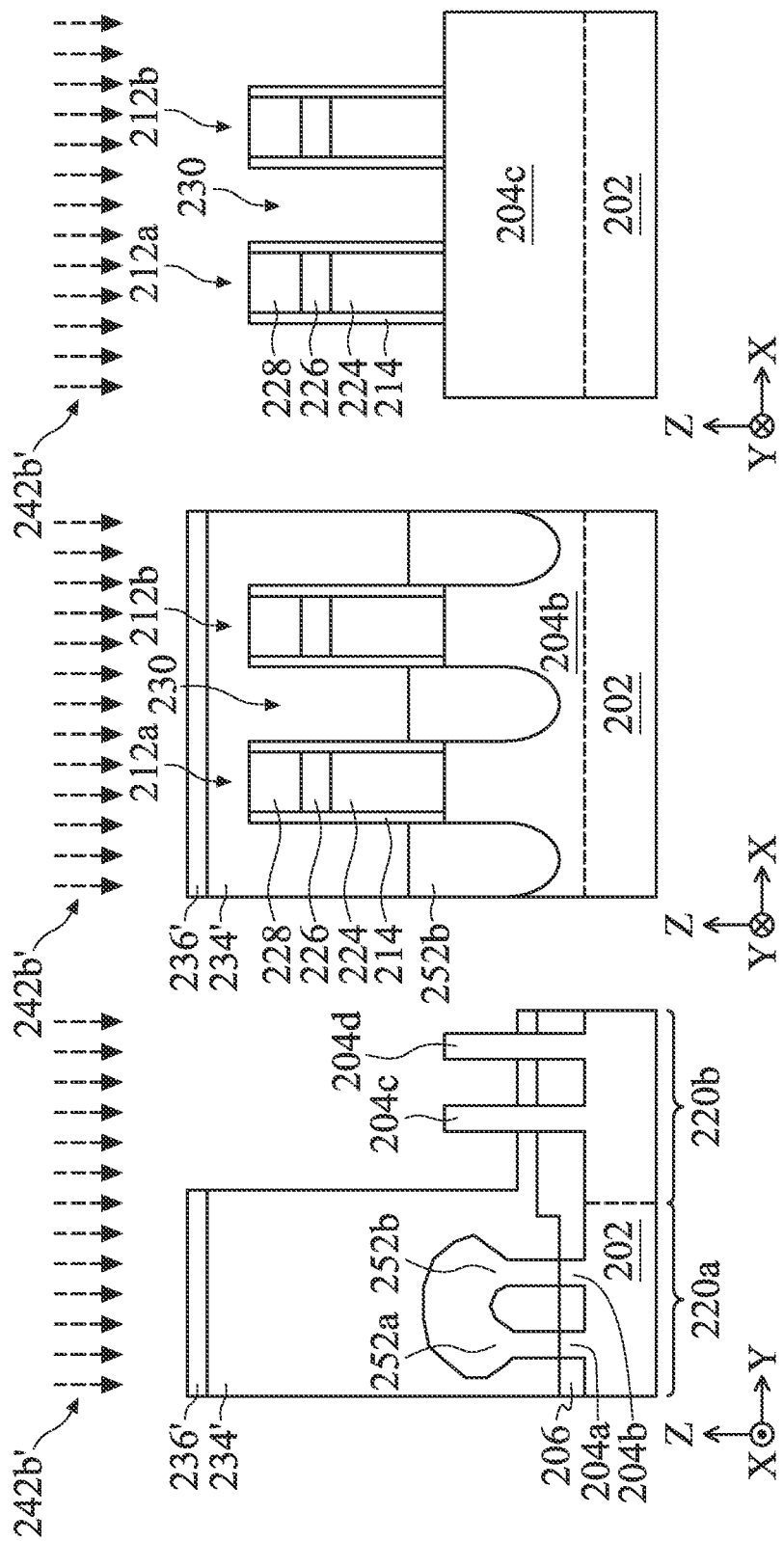
Figures 20A, 20B, 20C:
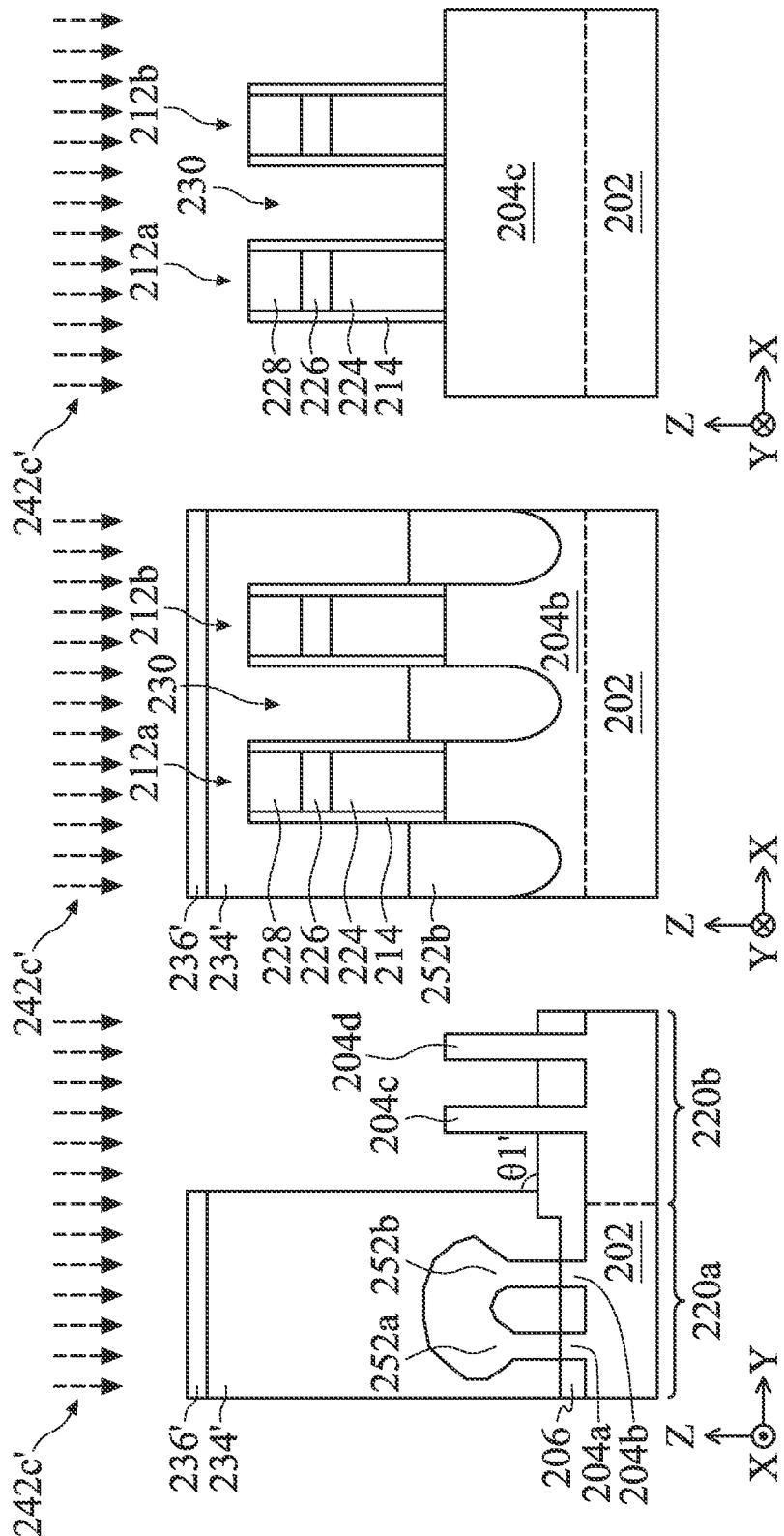
Figures 23A, 23B, 23C:
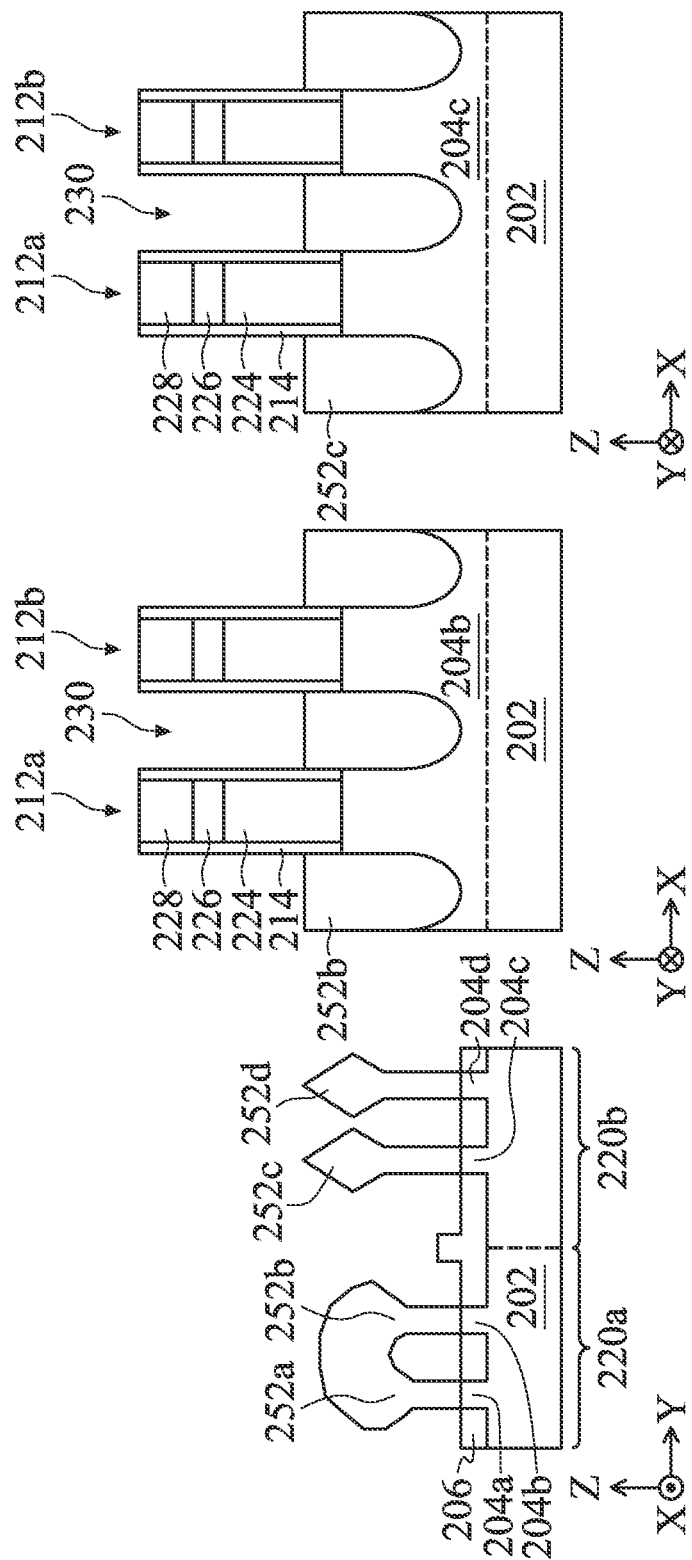

In some embodiments, after operation 130, a portion of the bottom layer 234' remains above the fin top for a height denoted as H3', as shown in FIG. 18C. In various embodiments, a ratio of the height H3' to the trench depth H1' (measured from fin top to gate structure top) ranges from about 1:4 to about 1:2. If H3':H1' is lower than 1:4, the remaining bottom layer 234' over the fin top may be too thin to protect fins from strong plasma bombardment. If H3':H1' is larger than 1:2, resist material residue may remain on bottom portions of the sidewalls of the trench 230 due to a relatively weaker etching process following operation 130. In some alternative embodiments, the bottom layer 234' is recessed below the fins 204c and 204d, as shown in FIGS. 19A-19C.

Referring to FIGS. 1C and 20A-20C, at operation 132, the method 100 etches a bottom portion of the bottom layer 234' and completely removes the bottom layer 234' from the NFET region 220b, thereby exposing the isolation feature 206 and the fins 204c and 204d in the S/D regions. Compared with operation 130, the etching process in operation 132 is relatively weaker, such as with less etching rate and larger etching directivity (e.g., substantially the same with that of operation 128). In some embodiments, the etching process in operation 132 is further weaker, such as with less etching rate and less etching directivity, than the etching process in operation 128. In some other embodiments, the etching process in operation 132 is weaker than the etching process in operation 130 but stronger than the etching process in operation 128. In one embodiment, operation 132 includes a wet etching process with a suitable etching solution, such as a hydrofluoric acid (HF) based solution, a sulfuric acid ($H_2SO_4$) based solution, a hydrochloric (HCl) acid based solution, an ammonium hydroxide ($NH_4OH$) based solution, other suitable etching solution, or combinations thereof. In some embodiments, operation 132 includes a dry etching process. In furtherance of the embodiments, operation 132 includes a plasma etching process 242c'. Various etching parameters can be tuned to weaken the plasma etching process 242c', such as etchant composition, etching temperature, etching solution concentration, etching time, etching pressure, source power, RF bias voltage, RF bias power, etchant flow rate, other suitable etching parameters, or combinations thereof. In a particular example, the plasma etching process 242c' has the same etchant, flow rate, gas pressure, bias voltage, frequency, and temperature as the plasma etching process 242a', which has smaller bias voltage and higher frequency than the plasma etching process 242b', but for a duration longer than that of the plasma etching process 242b' but shorter than that of the plasma etching process 242a', such as between about 15 seconds to about 30 seconds.

After operation 132, the sidewall 246' of the bottom layer 234' is straight and substantially perpendicular to a top surface of the isolation feature 206 (or a top surface of the substrate 202). Here, the term "substantially perpendicular" refers to an angle θ1' formed between the sidewall 246' and the top surface of the isolation feature 206 (or the top surface of the substrate 202) being in a range from about 88 degrees to about 95 degrees, such as from about 90 degrees to about 93 degrees in some examples.

Referring to FIGS. 1C and 21A-21C, at operation 134, the method 100 recesses the fins 204c and 204d in the S/D regions in an etching process 250'. In the illustrated embodiment, the method 100 at operation 134 also recesses the isolation feature 206 in the NFET region 220b, resulting in a protruding portion 256 over (or across) the boundary line 210 between the PFET region 220a and the NFET region 220b. The boundary line 210 may be an interface between an n-well in the substrate 202 in the PFET region 220a and a p-well in the substrate 202 in the NFET region 220b. A sidewall of the protruding portion 256 facing NFET region 220b is substantially perpendicular to a top surface of the isolation feature 206, such that an angle θ2' formed between the sidewall and the top surface of the isolation feature 206 is in a range from about 88 degrees to about 95 degrees, such as from about 90 degrees to about 93 degrees in some examples. The etching process 250' may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to recess the fins 204c and 204d and the isolation feature 206 may be suitable. In the illustrated embodiment, a top surface of the isolation feature 206 in the NFET region 220b remains flushed with top surfaces of the fins 204c and 204d.

The protruding portion 256 protrudes from other portions of the isolation feature 206 for a distance denoted as H4. Other portions of the isolation feature 206 has a thickness denoted as H5. The protruding portion 256 helps improving isolation between the PFET region 220a and the NFET region 220b. In some embodiments, H4:H5 ranges from about 2:5 to about 3:4. If H4:H5 is less than about 2:5, the protruding portion is too low to bring substantial isolation improvement. If H4:H5 is larger than about 3:4, the other portions of the isolation feature 206 surrounding the fins 204 is recessed too thin to provide enough isolation for bottom portions of the fins 204.

Referring to FIGS. 1C and 22A-22C, at operation 136, the method 100 forms epitaxial S/D features 252c and 252d over the fins 204c and 204d, respectively. The semiconductor material of epitaxial S/D features 252 is raised above the top surface of the fins 204. The epitaxial S/D features 252 in the NFET region 220b may include epitaxially grown silicon (Si) or silicon carbide (SiC). The epitaxial S/D features 252 in the NFET region 220b may further be doped with proper dopants suitable for n-type devices. For example, the epitaxial S/D features 252c and 252d may be doped with an n-type dopant such as phosphorus (P) or arsenic (As). Adjacent epitaxial S/D features 252c and 252d may be separated from each other in some embodiments, such as shown in FIG. 22A.

Referring to FIGS. 1C and 23A-23C, at operation 138, the method 100 removes the resist layer 232' (e.g., bottom layer 234', middle layer 236', and/or top photoresist layer 238' if any) from the device 200. Operation 138 may include any suitable etching process including wet etching, dry etching, reactive ion etching, ashing, and/or other suitable technique. After operation 138, the device 200 in the PFET region 220a is also exposed.

Referring to FIGS. 1C and 24A-24C, at operation 140, the method 100 performs further steps to form various features of the device 200. Operation 140 includes a variety of processes. In some embodiments, operation 140 forms a contact etch stop layer (not shown) over the epitaxial S/D features 252 and an interlayer dielectric layer (ILD) 260 on the contact etch stop layer. The ILD layer 260 may comprise tetraethylorthosilicate (TEOS) oxide, undoped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 260 may be formed by PECVD, FCVD, or other suitable methods. In some embodiments, operation 140 replaces gate structures 212a and 212b with high-k metal gate stacks 262a and 262b (collectively as high-k metal gate stacks 262). The high-k metal gate stacks 262 include a high-k dielectric layer 264 and a conductive layer 266. The high-k metal gate stacks 262 may further include an interfacial layer 268 (e.g., silicon dioxide or silicon oxynitride) between the high-k dielectric layer 264 and the fins 204. The interfacial layer 268 may be formed using chemical oxidation, thermal oxidation, ALD, CVD, and/or other suitable methods. The high-k dielectric layer 264 may include one or more high-k dielectric materials (or one or more layers of high-k dielectric materials), such as hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), or a combination thereof. The high-k dielectric layer 264 may be deposited using CVD, ALD and/or other suitable methods. The conductive layer 266 includes one or more metal layers, such as work function metal layer(s), conductive barrier layer(s), and metal fill layer(s). The work function metal layer may be a p-type or an n-type work function layer depending on the type (PFET or NFET) of the device. The p-type work function layer comprises a metal with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal with sufficiently low effective work function, selected from but not restricted to the group of titanium (Ti), aluminum (Al), tantalum carbide (TaC), tantalum carbide nitride (TaCN), tantalum silicon nitride (TaSiN), titanium silicon nitride (TiSiN), or combinations thereof. The metal fill layer may include aluminum (Al), tungsten (W), cobalt (Co), and/or other suitable materials.

The method 100 may further performs a CMP process to remove excessive materials and form metal interconnects electrically connecting the source, drain, gate terminals of various transistors to complete the fabrication of the device 200.

Figure 25:
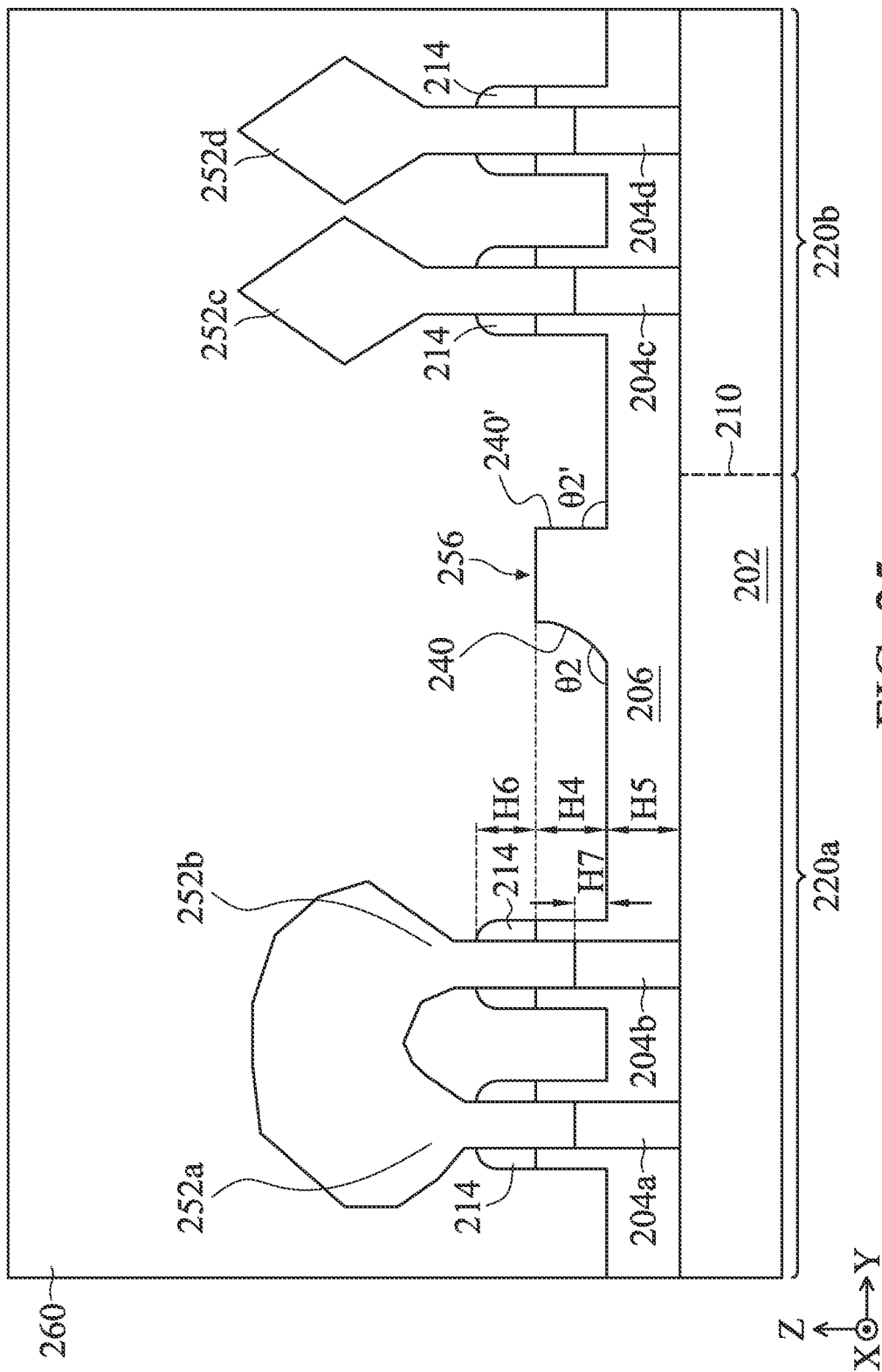

Reference is now made to FIG. 25. An alternative embodiment of the device 200 along the A-A line (a cut between adjacent gate stacks in Y-Z plane), upon conclusion of operation 140 in the method 100, is illustrated. In the alternative embodiment, vertical portions of the gate spacers 214 remain on sidewalls of the epitaxial S/D features 252. The remaining vertical portions of the gate spacers 214 may be due to the anisotropic etching process in the gate spacer formation which mainly etches away horizontal portions of the gate spacers 214. During the recessing of the fins 204 at operation 116 and/or 134, the vertical portions of the gate spacers 214 may also suffer some etching loss due to the etching contrast between the materials of the fins 204 and the gate spacers 214. In some embodiments, the remaining vertical portions of the gate spacers 214 has a height H6 ranging from about 5 nm to about 10 nm. The vertical portions of the gate spacers 214 protects portions of the isolation feature 206 directly thereunder from the recessing process at operation 116 and/or operation 134. Therefore, similar to the protruding portion 256, these portions of the isolation feature 206 directly under the gate spacers 214 also protrude from the recessed top surface of the isolation feature 206 for a substantially same distance H4. As discussed above, in some embodiments, H4:H5 ranges from about 2:5 to about 3:4. Compared with FIG. 24A where top surfaces of the fins 204 and the isolation feature 206 are depicted as substantially coplanar, in FIG. 25 the recessed fins 204 have top surfaces higher than the recessed top surface of the isolation feature 206 for a distance H7 ranging from about 10 nm to about 15 nm in some embodiments. This is mainly due to that the etchant targeting at the fins 204 has to go through relatively narrow openings formed between vertical portions of the gate spacers 214 to reach the fins 204, which slows down the etch rate of the fins 204, when the fins 204 are recessed below the vertical portions of the gate spacers 214.

Still referring to FIG. 25, depending on circuit layouts, one of the PFET region 220a and NFET region 220b may have larger process window, allowing the method 100 to skip the tri-etching process in that region and use a conventional one step etching process to remove the bottom portion of the resist layer 234 or 234', in order to simplify etching process and thus increase production throughput. For example, in static random-access memory (SRAM) bit cell layouts, n-well and p-well are often interleaved but with different widths and/or different distances between fins above respective wells and well boundaries (also as region boundaries) 210. In the illustrated embodiment, the PFET region 220a has larger process window and larger fin to region boundary distance, and the method 100 may skip operations 110-114 and etch the bottom portion of the resist layer 234 in a conventional one step etching process. Consequently, the resultant protruding portion 256 has a curvy sidewall 240 facing the PFET region 220a and a substantially vertical sidewall 240' facing the NFET region 220b. The angle θ2 formed between the curvy sidewall 240 and the top surface of the isolation feature 206 is in a range from about 100 degrees to about 130 degrees, and the angle θ2' formed between the vertical sidewall 240' and the top surface of the isolation feature 206 is in a range from about 88 degrees to about 95 degrees, which is smaller than θ2. The larger process window on the side of the PFET region 220a allows trading sidewall profiles to higher production throughput. In some alternative embodiments, if NFET region 220b has larger process window, the method 100 may skip operations 128-132 and the curvy sidewall would face the NFET region 220b instead. Further, the lateral position of the protruding portion 256 does not have to be directly above the boundary line 210, but in some embodiments can be shifted to the region with larger process window in order to leave more distance between the fins and the protruding portion 256 for the other region. In the illustrated embodiment, the protruding portion 256 (the vertical sidewall 240') is fully in the PFET region 220a. Alternatively, the protruding portion 256 can be fully in the NFET region 220b instead, if the NFET region 220b provides larger process window.

Although not intended to be limiting, one or more embodiments of the present disclosure provide many benefits to semiconductor devices and the formation thereof. For example, embodiments of the present disclosure provide multiple etching steps in removing resist material from high aspect ratio trenches between adjacent gate structures, which beneficially increases fin height uniformity in fin recessing process. The fabrication method also creates a protruding isolation feature across a boundary line between regions for different types of FinFETs (e.g., n-type FinFET and p-type FinFET). The protruding isolation feature increases isolation between different regions and improves device leakage performance. Furthermore, the fabrication method can be easily integrated into existing semiconductor fabrication processes.

In one exemplary aspect, the present disclosure is directed to a method for manufacturing a semiconductor device. The method includes a method of forming a semiconductor device. The method includes providing a structure that includes a substrate, a fin protruding from the substrate, an isolation feature surrounding the fin, and a gate structure engaging the fin; depositing a resist layer covering the fin, the isolation feature, and the gate structure; performing a first etching process to recess the resist layer below a top surface of the gate structure; performing a second etching process to further recess the resist layer, wherein the second etching process has a higher etching rate than the first etching process; performing a third etching process to remove the resist layer, wherein the third etching process has a lower etching rate than the second etching process; recessing the fin; and forming an epitaxial source/drain (S/D) feature above the fin. In some embodiments, the recessing of the fin also includes recessing the isolation feature. In some embodiments, after the recessing of the isolation feature, a top surface of the isolation feature has a step profile. In some embodiments, each of the first, second, and third etching processes includes a plasma etching process under a bias voltage for a duration. In some embodiments, the bias voltage of the second etching process is higher than that of either the first etching process or the third etching process. In some embodiments, the duration of the second etching process is shorter than that of either the first etching process or the third etching process. In some embodiments, each of the first, second, and third etching processes uses a same etchant. In some embodiments, the etchant includes a sulfur-containing compound. In some embodiments, after the performing of the second etching process, a top surface of the resist layer is above a top surface of the fin. In some embodiments, after the performing of the second etching process, a top surface of the resist layer is below a top surface of the fin.

In another exemplary aspect, the present disclosure is directed to a method for manufacturing a semiconductor device. The method includes a method of forming a semiconductor device. The method includes providing a structure that includes a substrate with a first region and a second region, an isolation feature over the substrate, a first fin extending from the first region of the substrate and through the isolation feature, a second fin extending from the second region of the substrate and through the isolation feature, and a gate structure engaging the first and second fins; recessing the first fin and a first portion of the isolation feature surrounding the first fin; epitaxially growing a first source/drain (S/D) feature on the first fin; recessing the second fin and a second portion of the isolation feature surrounding the second fin, resulting in a protruding portion of the isolation feature between the first and second portions; and epitaxially growing a second S/D feature on the second fin. In some embodiments, the method further includes depositing a first resist layer covering the first and second regions; removing the first resist layer from the first region prior to the recessing of the first fin and the first portion of the isolation feature; removing the first resist layer from the second region; depositing a second resist layer covering the first and second regions; removing the second resist layer from the second region prior to the recessing of the second fin and the second portion of the isolation feature; and removing the second resist layer from the first region. In some embodiments, each of the removing of the first resist layer from the first region and the removing of the second resist layer from the second region includes etching an upper portion of either the first resist layer or the second resist layer with a first etching directivity; and etching a lower portion of either the first resist layer or the second resist layer with a second etching directivity that is lower than the first etching directivity. In some embodiments, a sidewall of the protruding portion of the isolation feature is substantially perpendicular to a top surface of the isolation feature. In some embodiments, the protruding portion of the isolation feature is across a boundary line between the first and second regions. In some embodiments, the first and second S/D features are of opposite types.

In yet another exemplary aspect, the present disclosure is directed to a semiconductor device. The semiconductor device includes a semiconductor device. The semiconductor device includes a substrate having a p-type region and an n-type region; an isolation feature over the substrate; a first fin protruding from the substrate and through the isolation feature in the p-type region; a p-type epitaxial feature over a source/drain (S/D) region of the first fin; a second fin protruding from the substrate and through the isolation feature in the n-type region; and an n-type epitaxial feature over an S/D region of the second fin, wherein a portion of the isolation feature across the p-type region and the n-type region is higher than other portions of the isolation feature. In some embodiments, a sidewall of the portion of the isolation feature is substantially perpendicular to a top surface of the substrate. In some embodiments, the portion of the isolation feature is higher than the first and second fins in respective S/D regions. In some embodiments, the semiconductor device further includes a gate stack engaging a channel region of the first fin and a channel region of the second fin.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
 a substrate having a first region and a second region of opposite conductivity types;
 an isolation feature over the substrate;
 a first fin protruding from the substrate and through the isolation feature in the first region;
 a first epitaxial feature over the first fin;
 a second fin protruding from the substrate and through the isolation feature in the second region; and
 a second epitaxial feature over the second fin,
 wherein a portion of the isolation feature located between the first fin and the second fin protrudes from a top surface of the isolation feature.

2. The semiconductor device of claim 1, wherein the portion of the isolation feature includes a first sidewall facing the first fin and a second sidewall facing the second fin, and wherein at least one of the first and second sidewalls is substantially perpendicular to the top surface of the isolation feature.

3. The semiconductor device of claim 2, wherein each of the first and second sidewalls is substantially perpendicular to the top surface of the isolation feature.

4. The semiconductor device of claim 2, wherein another one of the first and second sidewalls is tilted with respect to the one of the first and second sidewalls.

5. The semiconductor device of claim 1, wherein the portion of the isolation feature is fully located in one of the first and second regions.

6. The semiconductor device of claim 1, wherein the portion of the isolation feature laterally expands across a boundary between the first and second regions.

7. The semiconductor device of claim 1, wherein the portion of the isolation feature protrudes from the top surface of the isolation feature for a first vertical distance, the top surface of the isolation feature is spaced from the substrate for a second vertical distance, and a ratio between the first vertical distance and the second vertical distance ranges from about 2:5 to about 3:4.

8. The semiconductor device of claim 1, wherein the portion of the isolation feature is above a bottom surface of the first epitaxial feature.

9. The semiconductor device of claim 8, wherein the portion of the isolation feature is above a bottom surface of the second epitaxial feature.

10. A semiconductor device, comprising:
a semiconductor substrate;
an isolation feature over the semiconductor substrate;
a fin protruding from the semiconductor substrate and through the isolation feature;
a gate structure engaging the fin;
a sidewall spacer disposed on sidewalls of the gate structure; and
an epitaxial feature over the fin,
wherein the isolation feature includes a first portion having a first thickness and a second portion having a second thickness that is larger than the first thickness, the first portion is located between the fin and the second portion, and a top surface of the first portion extends continuously to a sidewall of the second portion.

11. The semiconductor device of claim 10, wherein the sidewall of the second portion is substantially perpendicular to the top surface of the first portion.

12. The semiconductor device of claim 10, wherein the sidewall spacer extends to sidewalls of the epitaxial feature.

13. The semiconductor device of claim 12, wherein the isolation feature includes a third portion directly under the sidewall spacer and in contact with the sidewalls of the epitaxial feature, and wherein the third portion has a third thickness that is larger than the first thickness.

14. The semiconductor device of claim 13, wherein the third thickness is substantially equal to the second thickness.

15. The semiconductor device of claim 10, wherein a topmost portion of the second portion of the isolation feature is above a top surface of the fin.

16. The semiconductor device of claim 10, wherein the semiconductor substrate includes a first region of a first conductivity type and a second region of a second conductivity type that is opposite to the first conductivity type, the fin is located in the first region, and the second portion of the isolation feature laterally expands across the first and second regions.

17. A method of forming a semiconductor device, comprising:
providing a structure that includes a substrate, a fin protruding from the substrate, an isolation feature surrounding the fin, and a gate structure engaging the fin;
depositing a resist layer covering the fin, the isolation feature, and the gate structure;
performing a first etching process to recess the resist layer below a top surface of the gate structure;
performing a second etching process to further recess the resist layer;
performing a third etching process to remove the resist layer, wherein the first, second, and third etching processes have different etching rates;
recessing the fin; and
forming an epitaxial feature above the fin.

18. The method of claim 17, wherein the second etching process has a highest etching rate among the first, second, and third etching processes.

19. The method of claim 17, wherein after the first etching process, a top surface of the fin remains covering by the resist layer.

20. The method of claim 19, wherein after the second etching process, the top surface of the fin remains covering by the resist layer.

* * * * *